US011973082B2

(12) United States Patent
Yoon et al.

(10) Patent No.: US 11,973,082 B2
(45) Date of Patent: Apr. 30, 2024

(54) INTEGRATED CIRCUIT DEVICES

(71) Applicant: Samsung Electronics Co., Ltd., Suwon-si (KR)

(72) Inventors: Seokhyeon Yoon, Seoul (KR); Junyoung Park, Hwaseong-si (KR); Woocheol Shin, Seoul (KR); Seunghun Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 330 days.

(21) Appl. No.: 17/410,325

(22) Filed: Aug. 24, 2021

(65) Prior Publication Data

US 2022/0208790 A1    Jun. 30, 2022

(30) Foreign Application Priority Data

Dec. 24, 2020 (KR) .................. 10-2020-0183521

(51) Int. Cl.
| | |
|---|---|
| *H01L 27/12* | (2006.01) |
| *H01L 29/06* | (2006.01) |
| *H01L 29/08* | (2006.01) |
| *H01L 29/786* | (2006.01) |

(52) U.S. Cl.
CPC ...... *H01L 27/1203* (2013.01); *H01L 27/1222* (2013.01); *H01L 29/0653* (2013.01); *H01L 29/0665* (2013.01); *H01L 29/0847* (2013.01); *H01L 29/78696* (2013.01)

(58) Field of Classification Search
CPC ............. H01L 27/1203; H01L 27/1222; H01L 29/0653; H01L 29/0665; H01L 29/0847; H01L 29/78696; H01L 29/42392; H01L 27/1207; H01L 21/823807; H01L 21/823892; H01L 27/092; H01L 29/1079
See application file for complete search history.

(56) References Cited

U.S. PATENT DOCUMENTS

| | | |
|---|---|---|
| 7,316,968 B2 | 1/2008 | Lee et al. |
| 7,402,483 B2 | 7/2008 | Yun et al. |
| 7,427,788 B2 | 9/2008 | Li et al. |
| 8,389,347 B2 | 3/2013 | Tezuka et al. |

(Continued)

FOREIGN PATENT DOCUMENTS

KR    100652381 B1    12/2006

*Primary Examiner* — Changhyun Yi
(74) *Attorney, Agent, or Firm* — Myers Bigel, P.A.

(57) ABSTRACT

An integrated circuit device includes: a semiconductor on insulator (SOI) substrate layer including a base substrate layer, an insulating substrate layer, and a cover substrate layer; a semiconductor substrate layer; a plurality of first fin-type active areas and a plurality of second fin-type active areas each defined by a plurality of trenches, and extending in a first horizontal direction, in above the SOI substrate layer and the semiconductor substrate layer, respectively; a plurality of nanosheet stacked structures comprising nanosheets extending in parallel with each other and spaced apart from upper surfaces of the plurality of first fin-type active areas and the plurality of second fin-type active areas; a plurality of first source/drain regions extending into the SOI substrate layer; and a plurality of second source/drain regions extending into the semiconductor substrate layer. Lower surfaces of the first and second source/drain regions may not be coplanar with each other.

20 Claims, 28 Drawing Sheets

(56) References Cited

U.S. PATENT DOCUMENTS

| | | |
|---|---|---|
| 10,236,381 B2 | 3/2019 | Cheng et al. |
| 10,269,914 B2 | 4/2019 | Wu et al. |
| 10,332,985 B2 | 6/2019 | Wong et al. |
| 10,453,736 B2 | 10/2019 | Chao et al. |
| 10,453,750 B2 | 10/2019 | Pawlak et al. |
| 10,692,991 B2 | 6/2020 | Chanemougame et al. |
| 2017/0243782 A1* | 8/2017 | Wu .................. H01L 21/308 |
| 2020/0006333 A1 | 1/2020 | Noh et al. |
| 2020/0219879 A1 | 7/2020 | Shin et al. |
| 2022/0302143 A1* | 9/2022 | Cheng .................. H01L 29/516 |
| 2022/0302144 A1* | 9/2022 | Cheng .................. H10B 51/40 |

* cited by examiner

INTEGRATED CIRCUIT DEVICES

CROSS-REFERENCE TO RELATED APPLICATION

This application is based on and claims priority under 35 U.S.C. § 119 to Korean Patent Application No. 10-2020-0183521, filed on Dec. 24, 2020, in the Korean Intellectual Property Office, the contents of which are incorporated by reference herein in their entireties.

BACKGROUND

The inventive concepts relate to integrated circuit devices including multi-gate metal-oxide-semiconductor field effect transistors (MOSFETs).

As the degree of integration in integrated circuit device is increased, sizes thereof are being reduced to extreme dimensions (e.g., extremely small dimensions), and the scaling of integrated circuit devices may be reaching limitations. Accordingly, new methods of manufacturing and using structural changes of the integrated circuit devices are being considered in order to improve the performance of the integrated circuit devices. For example, an integrated circuit device equipped with a transistor having a new structure such as a multi-gate MOSFET has been proposed.

SUMMARY

The inventive concepts provide integrated circuit devices equipped with transistors including multi-gate metal-oxide-semiconductor field effect transistors (MOSFETs) having improved operation characteristics.

To achieve the above technical object, and/or to achieve other technical objects relevant to the present disclosure, the inventive concept provides integrated circuit devices that may include: a first region including a semiconductor on insulator (SOI) substrate layer including a base substrate layer, an insulating substrate layer, and a cover substrate layer, and a second region including a semiconductor substrate layer; a plurality of first fin-type active areas defined by a first plurality of trenches in the first region, the first fin-type active areas protruding from a main surface of the SOI substrate layer and extending in a first horizontal direction; a plurality of second fin-type active areas defined by a second plurality of trenches in the second region, the second fin-type active areas protruding from a main surface of the semiconductor substrate layer and extending in the first horizontal direction; a plurality of nanosheet stacked structures above the plurality of first fin-type active areas and the plurality of second fin-type active areas, each of the plurality of nanosheet stacked structures comprising a plurality of nanosheets extending in parallel with each other and spaced apart from upper surfaces of the plurality of first fin-type active areas and the plurality of second fin-type active areas; a plurality of first source/drain regions between adjacent nanosheet stacked structures in the first region, each of the first source/drain regions extending into the SOI substrate layer and in contact with the insulating substrate layer and having a lower surface at a first vertical level; and a plurality of second source/drain regions in the second region, each of the plurality of second source/drain regions extending into the semiconductor substrate layer and having a lower surface thereof at a second vertical level that is farther from the main surfaces of the SOI substrate layer and the semiconductor substrate layer than the first vertical level.

The inventive concepts provide an integrated circuit device that may include: a semiconductor on insulator (SOI) substrate layer including a base substrate layer, an insulating substrate layer, and a cover substrate layer in a first region; a semiconductor substrate layer in a second region; a plurality of first fin-type active areas and a plurality of second fin-type active areas defined by a plurality of trenches and extending in a first horizontal direction, on the SOI substrate layer and the semiconductor substrate layer, respectively; a plurality of first nanosheets extending in parallel with each other and spaced apart in a vertical direction from the plurality of first fin-type active areas; a plurality of gate electrodes extending in a second horizontal direction that crosses the first horizontal direction, the plurality of gate electrodes on the plurality of first fin-type active areas and the plurality of second fin-type active areas, first portions of the plurality of gate electrodes between vertically adjacent first nanosheets; a gate dielectric layer between the first nanosheets and the plurality of first fin-type active areas; a plurality of first source/drain regions between horizontally adjacent first nanosheets above the plurality of first fin-type active areas, each of the plurality of first source/drain regions extending into the SOI substrate layer to contact the insulating substrate layer and having a lower surface at a first vertical level above the plurality of first fin-type active areas; and a plurality of second source/drain regions above the plurality of second fin-type active areas, each of the plurality of second source/drain regions extending into the semiconductor substrate layer on the plurality of second fin-type active areas and having a lower surface that is at a second vertical level above the plurality of second fin-type active areas that is higher than the first vertical level.

The inventive concepts provide an integrated circuit device that may include: a semiconductor on insulator (SOI) substrate layer including a base substrate layer, an insulating substrate layer, and a cover substrate layer in a first region; a semiconductor substrate layer in a second region different from the first region; a first impurity region in a portion of the SOI substrate layer having a first impurity type; a second impurity region in a portion of the semiconductor substrate layer having a second impurity type; a plurality of first fin-type active areas and a plurality of second fin-type active areas defined by a plurality of trenches and extending in a first horizontal direction, on the SOI substrate layer and the semiconductor substrate layer, respectively; a plurality of nanosheet stacked structures each comprising a plurality of nanosheets extending in parallel with each other and spaced apart from upper surfaces of the plurality of first fin-type active areas and the plurality of second fin-type active areas; a plurality of first source/drain regions connected to ends of the plurality of nanosheets adjacent to each other on the plurality of first fin-type active areas, the plurality of first source/drain regions extending through the cover substrate layer and into the insulating substrate layer, and including lower surfaces that are at a first vertical level; a plurality of second source/drain regions extending into the semiconductor substrate layer and contacting the second impurity region on the plurality of second fin-type active areas, the plurality of second source/drain regions including lower surfaces that are at a second vertical level that is higher than the first vertical level; a plurality of gate electrodes extending in a second horizontal direction that crosses the first horizontal direction, the plurality of gate electrodes extending on the plurality of first fin-type active areas and the plurality of second fin-type active areas, each of the plurality of gate electrodes including a main gate unit above a respective one of the plurality of nanosheet stacked structures, and a plurality of sub-gate units each underneath a respective nanosheet of the plurality of nanosheets of the respective one of the plurality of nanosheet stacked structures; a gate dielectric layer arranged between the plurality of gate electrodes and the plurality of nanosheets; and in the first region, a plurality of insulating spacers in the first region between the plurality of first fin-type active areas and the plurality of nanosheets, the plurality of insulating spacers covering first and second ends of each of the plurality of sub-gate units with the gate dielectric layer therebetween.

BRIEF DESCRIPTION OF THE DRAWINGS

Aspects of the present disclosure and examples of embodiments of the inventive concepts will be more clearly understood from the following detailed description taken in conjunction with the accompanying drawings in which.

DETAILED DESCRIPTION OF THE EMBODIMENTS

FIGS. 1 through 14B are cross-sectional views illustrating a fabrication method of an integrated circuit device, and illustrating an integrated circuit fabricated by using the fabrication method, according to some embodiments. FIGS. 1 through 8A and 9 through 14A are cross-sectional views illustrating Y-Z surfaces, and FIGS. 8B and 14B are cross-sectional views illustrating X-Z surfaces taken along V1-V1' line and V2-V2' line in FIGS. 8A and 14A, respectively.

Figure 1:
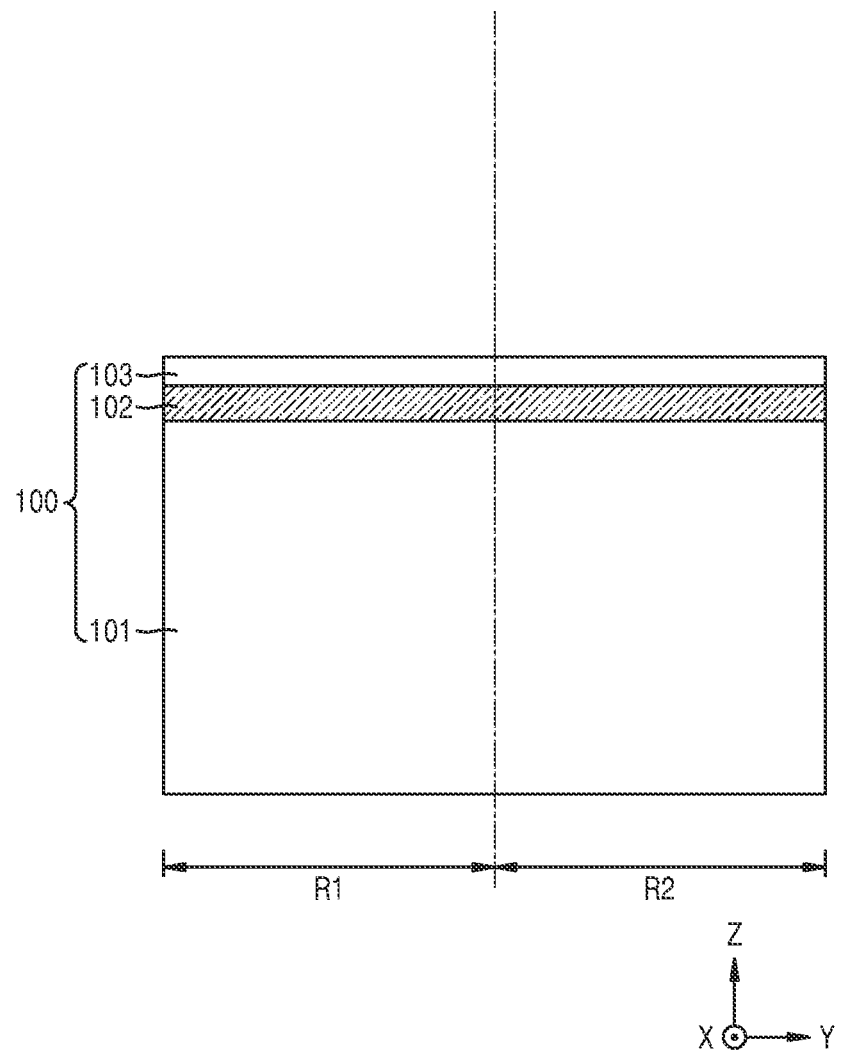
FIGS. 1 through 14B are cross-sectional views illustrating a fabrication method of an integrated circuit device, and also illustrate the integrated circuit device fabricated by using the fabrication method, according to some embodiments.

Referring to FIG. 1, a semiconductor on insulator (SOI) substrate 100 is provided. The SOI substrate 100 may include a base substrate layer 101, an insulating substrate layer 102, and a cover substrate layer 103, which are sequentially stacked, and a first region R1 and a second region R2 are provided.

The base substrate layer 101 may include a semiconductor such as Si and Ge, or a compound semiconductor material such as SiGe, SiC, GaAs, InAs, and InP. In some embodiments, the base substrate layer 101 may include at least one of a Group III-V material and a Group IV material. The Group III-V material may include a binary, ternary, or quaternary compound including at least one Group III element and at least one Group V element. The insulating substrate layer 102 may include an insulating material. The insulating substrate layer 102 may include, for example, a silicon oxide. The insulating substrate layer 102 may have a thickness of several tens of nm. For example, the insulating substrate layer 102 may have a thickness of about 10 nm (nanometers) to about 20 nm. The cover substrate layer 103 may include a semiconductor material such as Si and Ge, or a compound semiconductor material such as SiGe, SiC, GaAs, InAs, and InP. In some embodiments, the cover substrate layer 103 may include a semiconductor material of a different type from the base substrate layer 101. The cover substrate layer 103 may have a thickness of about 10 nm. For example, the base substrate layer 101 may include Si, and the cover substrate layer 103 may include any one of the Group III-V material described above.

Figure 2:
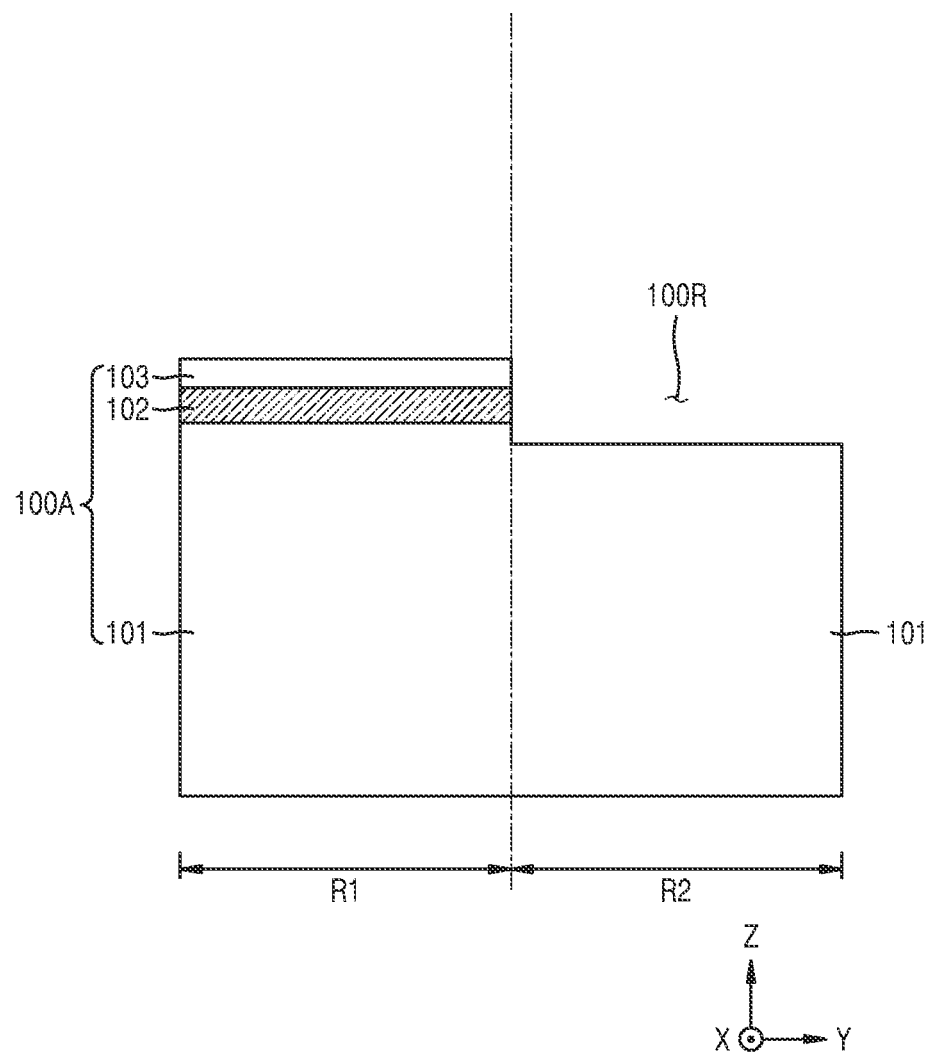

Referring to FIG. 2, a substrate recess 100R may be formed by removing both the cover substrate layer 103 and the insulating substrate layer 102 in the second region R2. An upper surface of the base substrate layer 101 may be exposed by the substrate recess 100R. In other words, the base substrate layer 101 may be exposed by a lower surface of the substrate recess 100R. In some embodiments, in the process of forming the substrate recess 100R, an upper portion of the base substrate layer 101 may be removed together with both the cover substrate layer 103 and the insulating substrate layer 102 in the second region R2.

The base substrate layer 101, the insulating substrate layer 102, and the cover substrate layer 103 sequentially stacked in the first region R1 may be referred to as an SOI substrate layer 100A. Accordingly, the SOI substrate layer 100A may be arranged in the first region R1, and the base substrate layer 101 may be arranged in the second region R2.

Figure 3:
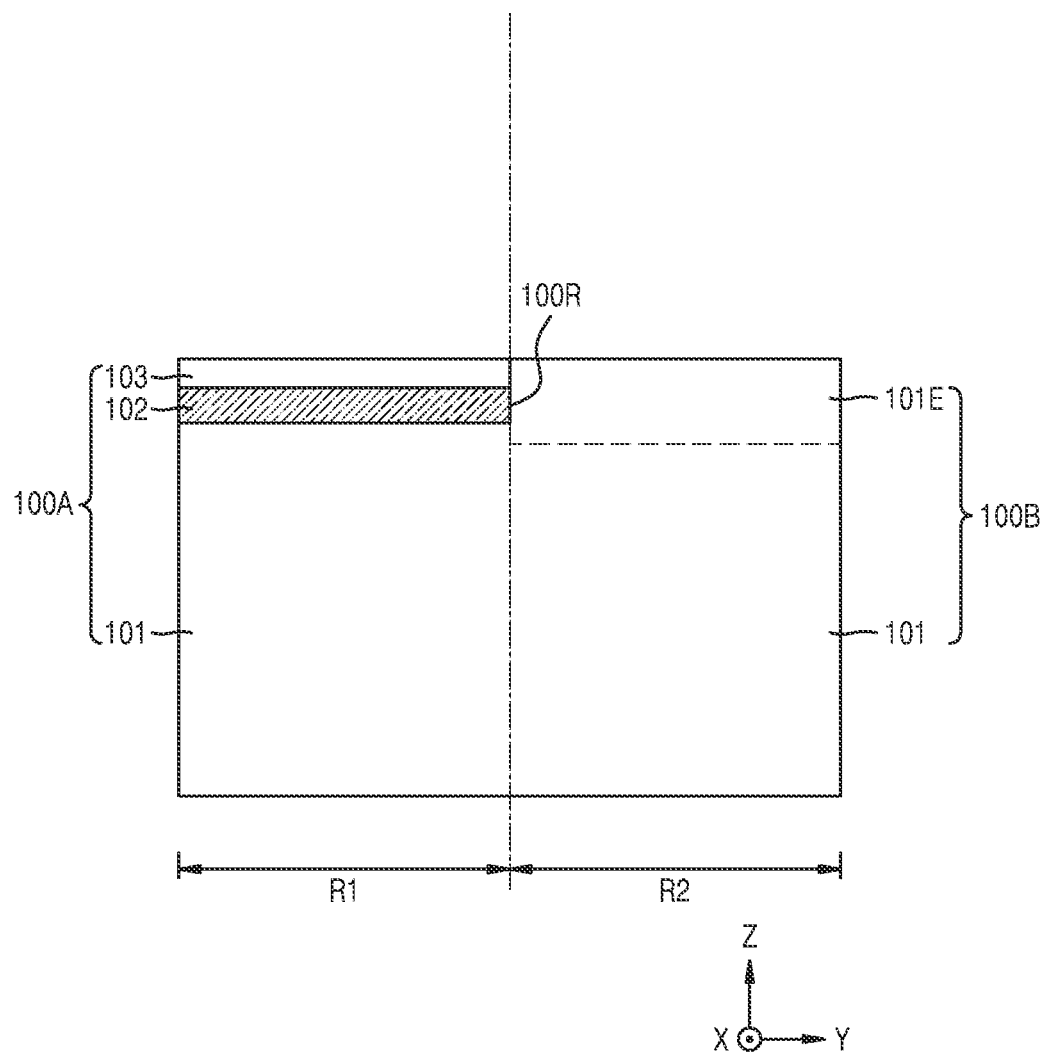

Referring to FIG. 3, in the second region R2, an epi-substrate layer 101E may be formed on the base substrate layer 101 that fills the substrate recess 100R. The epi-substrate layer 101E may include a semiconductor material. The epi-substrate layer 101E may be formed to have an identical crystallization to the base substrate layer 101, by using an epitaxial growth method using the base substrate layer 101 as a seed. In some embodiments, the epi-substrate layer 101E may include a semiconductor material of the same type as the base substrate layer 101. In some embodiments, the epi-substrate layer 101E may include a semiconductor material of a different type having identical crystallization to the base substrate layer 101. For example, the base substrate layer 101 may include Si, and the epi-substrate layer 101E may include GE or SiGe.

In the second region R2, the epi-substrate layer 101E formed on the base substrate layer 101 and the base substrate layer 101 may be referred to as a semiconductor substrate layer 100B. Accordingly, the SOI substrate layer 100A may be arranged in the first region R1, and the base substrate layer 101B may be arranged in the second region R2. Herein, the SOI substrate layer 100A and the semiconductor substrate layer 100B taken together may be referred to as a 'substrate.'

In some embodiments, an upper surface of the SOI substrate layer 100A may be at the same vertical level as an upper surface of the semiconductor substrate layer 100B from the upper surface of the base substrate layer 101. For example, the upper surface of the SOI substrate layer 100A may be coplanar with the upper surface of the semiconductor substrate layer 100B.

In some embodiments, a preliminary epi-layer may be formed over the first region R1 and the second region R2. The preliminary epi-layer may fill the substrate recess 100R and may cover an upper surface of the cover substrate layer 103 and an upper surface of the base substrate layer 101. Thereafter, the epi-substrate layer 101E may be formed by performing a planarization operation and removing a portion of an upper surface of the preliminary epi-layer so that the cover substrate layer 103 in the first region R1 is exposed. In the process of performing the planarization operation for forming the epi-substrate layer 101E, a portion of the upper surface of the cover substrate layer 103 may be removed together, and in this case, a thickness of the cover substrate layer 103 illustrated in FIG. 3 may be less than that of the cover substrate layer 103 illustrated in FIGS. 1 and 2.

In some embodiments, the preliminary epi-layer may include the same material as the cover substrate layer 103. After the preliminary epi-layer is formed that fills the substrate recess 100R and covers the upper surface of the cover substrate layer 103 and the upper surface of the base substrate layer 101 in the second region R2, the epi-substrate layer 101E may be formed by performing the planarization operation and removing a portion of the upper surface of the preliminary epi-layer. In some embodiments, some of the preliminary epi-layer may remain on the cover substrate layer 103, but because the preliminary epi-layer and the cover substrate layer 103 may include the same material as each other, the preliminary epi-layer and the cover substrate layer 103 may be handled as the cover substrate layer 103, and in this case, the thickness of the cover substrate layer 103 illustrated in FIG. 3 may be greater than that of the cover substrate layer 103 illustrated in FIGS. 1 and 2.

Figure 4:
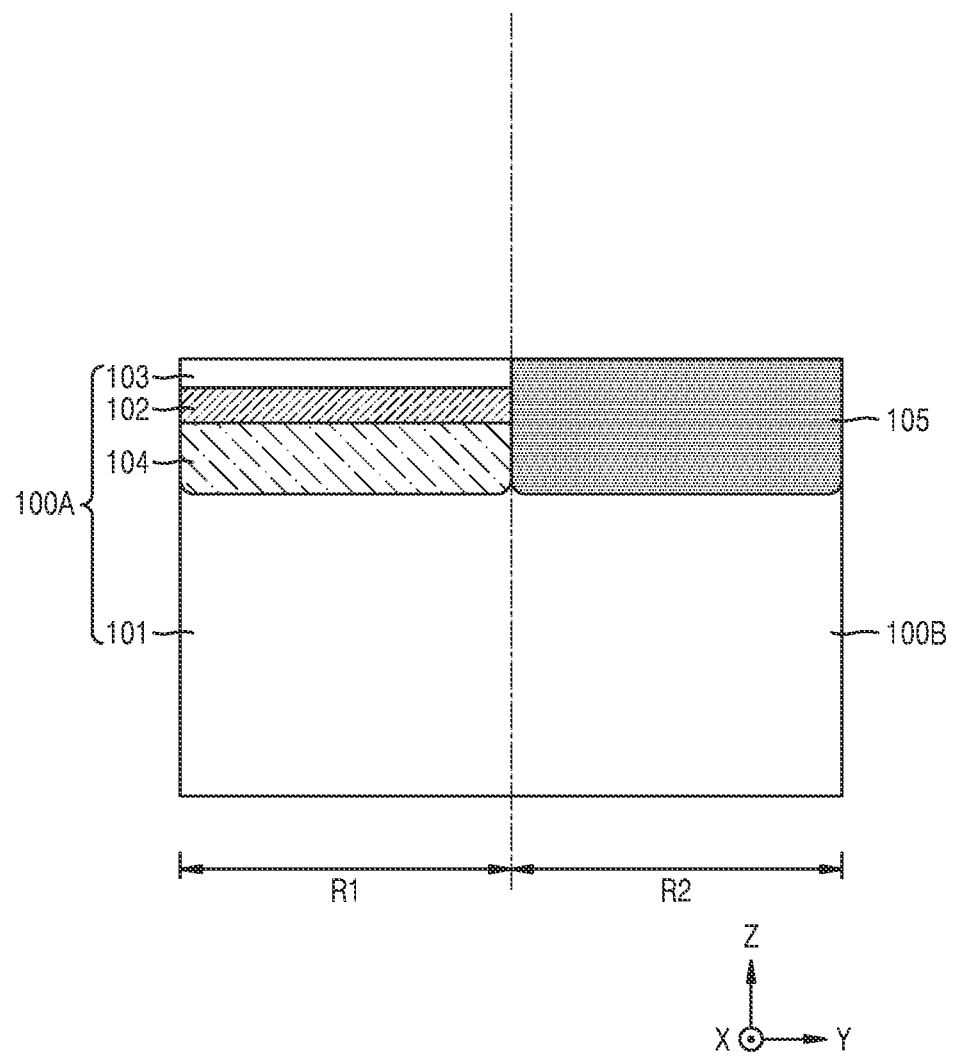

Referring to FIG. 4, a first impurity region 104 may be formed by injecting an impurity of a first conductivity into a portion of the SOI substrate layer 100A, and a second impurity region 105 may be formed by injecting an impurity of a second conductivity into a portion of the semiconductor substrate layer 100B. For example, when the first region R1 is an NMOS region, and the second region R2 is a PMOS region, the impurity of a first conductivity may include a p-type impurity, and the impurity of a second conductivity may include an n-type impurity. The lower surfaces of the first impurity region 104 and the second impurity region 105 may be located at the same vertical level as each other from the base substrate layer 101, but the present disclosure is not limited thereto. For example, the lower surface of the first impurity region 104 may be at a lower level than the lower surface of the second impurity region 105, or the lower surface of the first impurity region 104 may be at a higher level than the lower surface of the second impurity region 105.

In some embodiments, the first impurity region 104 may be formed at a portion of the upper surface of the base substrate layer 101 of the SOI substrate layer 100A, but the present disclosure is not limited thereto. In some embodiments, the first impurity region 104 may be formed in some of the upper portion of the base substrate layer 101 together with the cover substrate layer 103 of the SOI substrate layer 100A. In this case, the impurity of the first conductivity may be injected into the insulating substrate layer 102, but because the insulating substrate layer 102 includes an insulating material, the impurity of the first conductivity may not be applied to the first impurity region 104.

In some embodiments, the second impurity region 105 may be formed in some of the upper portion of the semiconductor substrate layer 100B, but the present disclosure is not limited thereto. In some embodiments, the second impurity region 105 may be formed only in some of an upper portion of the semiconductor substrate layer 100B, but in some embodiments may not be formed in the uppermost portion of the semiconductor substrate layer 100B.

Figure 5:
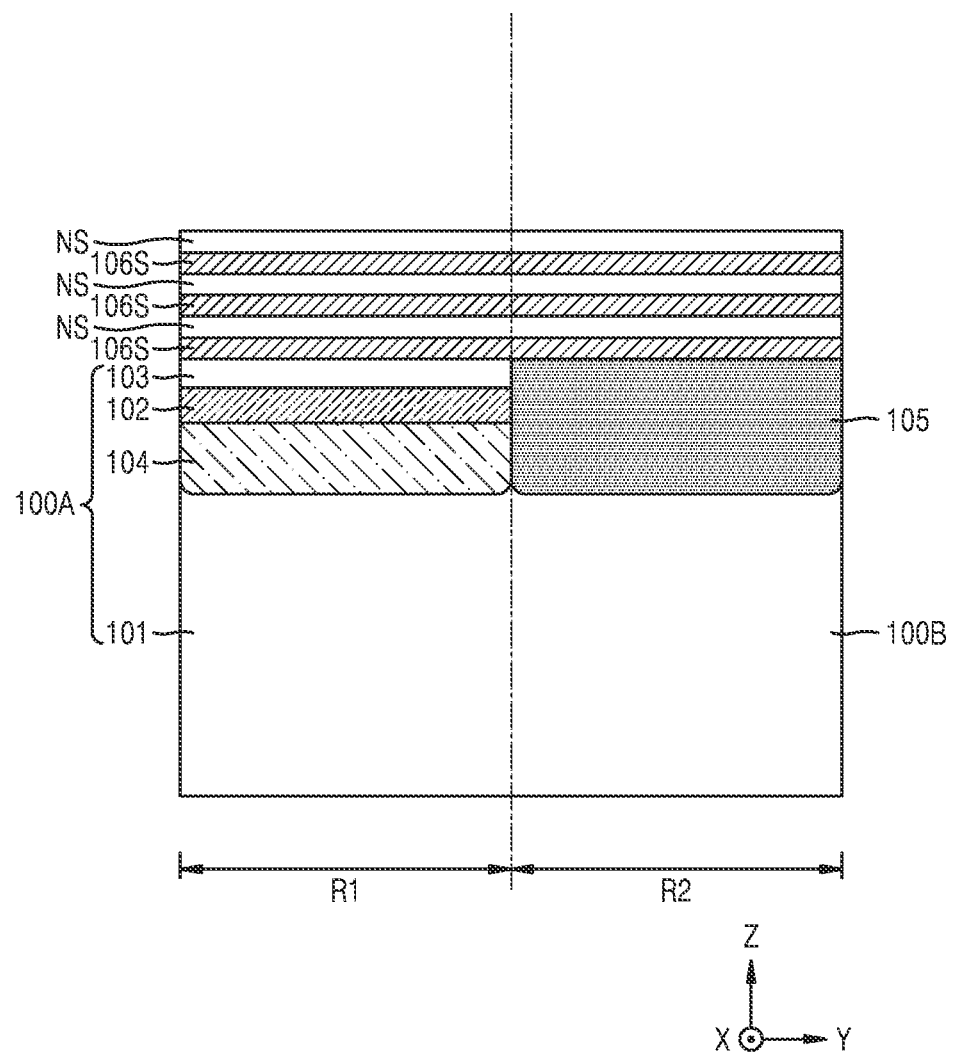

Referring to FIG. 5, a plurality of sacrificial semiconductor layers 106S and a plurality of nanosheet semiconductor layers NS may be alternately stacked on the substrate in the first region R1 in which the SOI substrate layer 100A is arranged and in the second region R2 in which the semiconductor substrate layer 100B is arranged. The plurality of sacrificial semiconductor layers 106S and the plurality of nanosheet semiconductor layers NS may include different semiconductor materials from each other. In some embodiments, the plurality of nanosheet semiconductor layers NS may include a single material. In some embodiments, the plurality of nanosheet semiconductor layers NS may include the same material as a material of at least one of a cover substrate layer 102 of the SOI substrate layer 100A and the semiconductor substrate layer 100B. In some embodiments, the plurality of sacrificial semiconductor layers 106S may include SiGe, and the plurality of nanosheet semiconductor layers NS may include Si, but the present disclosure is not limited thereto.

All of the plurality of sacrificial semiconductor layers 106S may be formed to have an equal thickness as each other, but the present disclosure is not limited thereto. In some embodiments, a thickness of a sacrificial semiconductor layer 106S closest to the substrate may be greater than thicknesses of the other remaining sacrificial semiconductor layers 106S.

Figure 6:
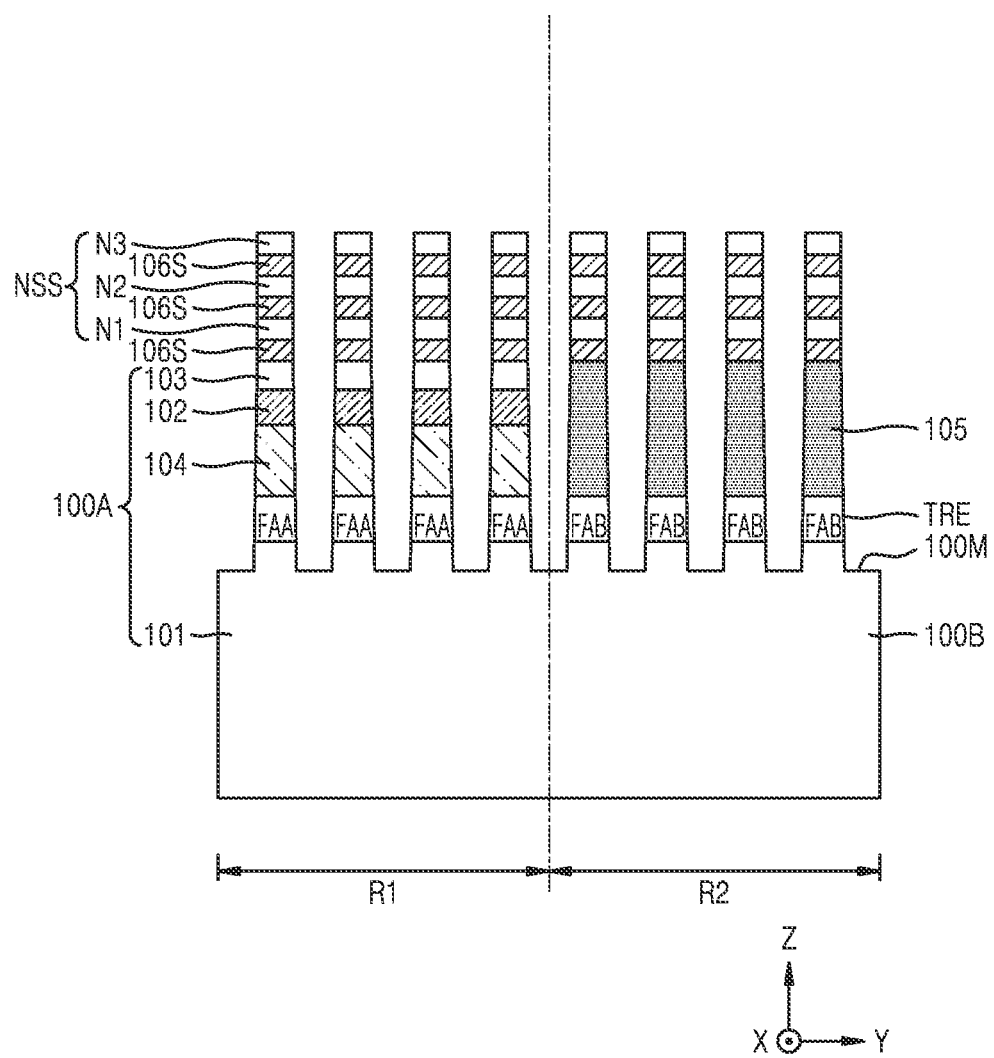

Referring to FIGS. 5 and 6 together, a plurality of trenches TRE may be formed by etching the stacked structure of the plurality of sacrificial semiconductor layers 106S and the plurality of nanosheet semiconductor layers NS, and portions of the SOI substrate layer 100A and the semiconductor substrate layer 100B. As a result, a plurality of first fin-type active areas FAA and a plurality of second fin-type active areas FAB defined by the plurality of trenches TRE may be formed in the first region R1 and the second region R2, respectively. The plurality of first fin-type active areas FAA may each include a portion of the SOI substrate layer 100A defined by the plurality of trenches TRE in the first region R1. The plurality of second fin-type active areas FAB may each include a portion of the semiconductor substrate layer 100B defined by the plurality of trenches TRE in the second region R2. In the present disclosure, the plurality of first fin-type active areas FAA and the plurality of second fin-type active areas FAB may be referred to as a plurality of fin-type active areas.

The plurality of first fin-type active areas FAA and the plurality of second fin-type active areas FAB may extend in parallel with each other in a first horizontal direction (X direction). The plurality of first fin-type active areas FAA and the plurality of second fin-type active areas FAB may protrude upward, that is, in a vertical direction (Z direction) from a main surface 100M of a substrate constituted by the SOI substrate layer 100A and the semiconductor substrate layer 100B. The main surface 100M of the substrate may be the main surface 100M of the SOI substrate layer 100A (e.g., base substrate layer 101) in the first region R1, and the main surface 100M of the semiconductor substrate layer 100B in the second region R2. In the first region R1, the plurality of first fin-type active areas FAA may be spaced apart at a constant pitch in a second horizontal direction (Y direction). In the second region R2, the plurality of second fin-type active areas FAB may be spaced apart at a constant pitch in the second horizontal direction (Y direction). In some embodiments, the plurality of first fin-type active areas FAA and the plurality of second fin-type active areas FAB may be arranged at an identical pitch in the second horizontal direction (Y direction) in the first region R1 and the second region R2, respectively, but the present disclosure not limited thereto. For example, the plurality of first fin-type active areas FAA may be spaced apart at a constant first pitch in the first region R1 in the second horizontal direction (Y direction), and the plurality of second fin-type active areas FAB may be spaced apart at a different constant second pitch in the second region R2 in the second horizontal direction (Y direction).

In each of the first region R1 and the second region R2, a stacked structure NSS including the plurality of sacrificial semiconductor layers 106S and a plurality of nanosheets N1, N2, and N3 may be arranged on the plurality of fin-type active areas, that is, the plurality of first fin-type active areas FAA and the plurality of second fin-type active areas FAB. The stacked structure NSS of the plurality of nanosheets N1, N2, and N3 may be formed by removing a portion of the plurality of nanosheet semiconductor layers NS by etching.

Figure 7:
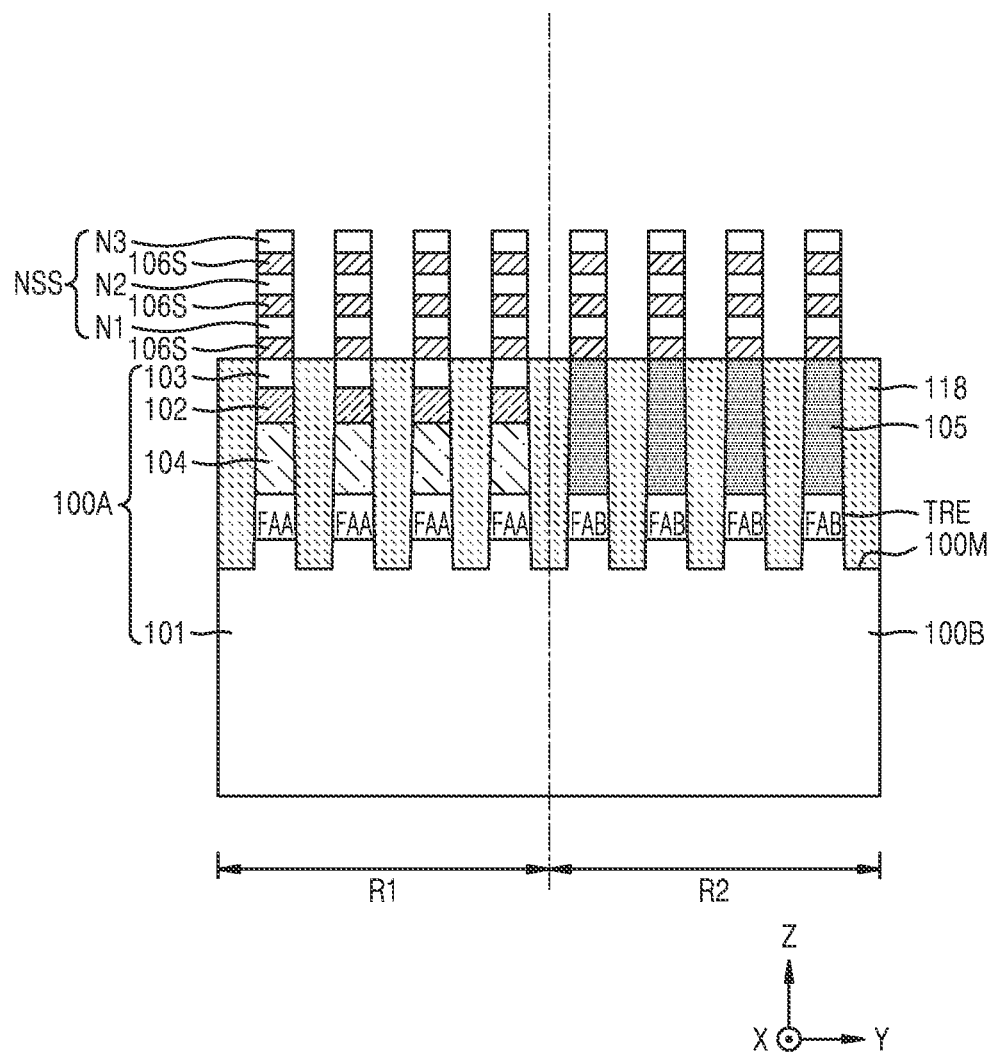

Referring to FIG. 7, a preliminary device separating layer may be formed that fills the plurality of trenches TRE, and thereafter a device separating layer 118 may be formed by performing a recess process and removing a certain thickness from an upper portion of the preliminary device separating layer.

The preliminary device separating layer may be formed on side surfaces of the plurality of first fin-type active areas FAA and the plurality of second fin-type active areas FAB, on side walls and an upper surfaces of the stacked structures NSS of the plurality of nanosheets N1, N2, and N3, and on side surfaces and upper surfaces of the SOI substrate layer 100A and the semiconductor substrate layer 100B. The recess process may include performing dry etching, wet etching, or an etching process combining dry and wet etching.

The device separating layer 118 may be formed to include an upper surface that is located at the same level as, or located at substantially at a similar vertical level to, the upper surfaces of the plurality of first fin-type active areas FAA and the plurality of second fin-type active areas FAB. In other words, the side wall of the stacked structure NSS of the plurality of nanosheets N1, N2, and N3 and the side walls of the plurality of sacrificial semiconductor layers 106S, which are on the plurality of first fin-type active areas FAA and on the plurality of second fin-type active areas FAB, may be exposed.

Figure 8A:
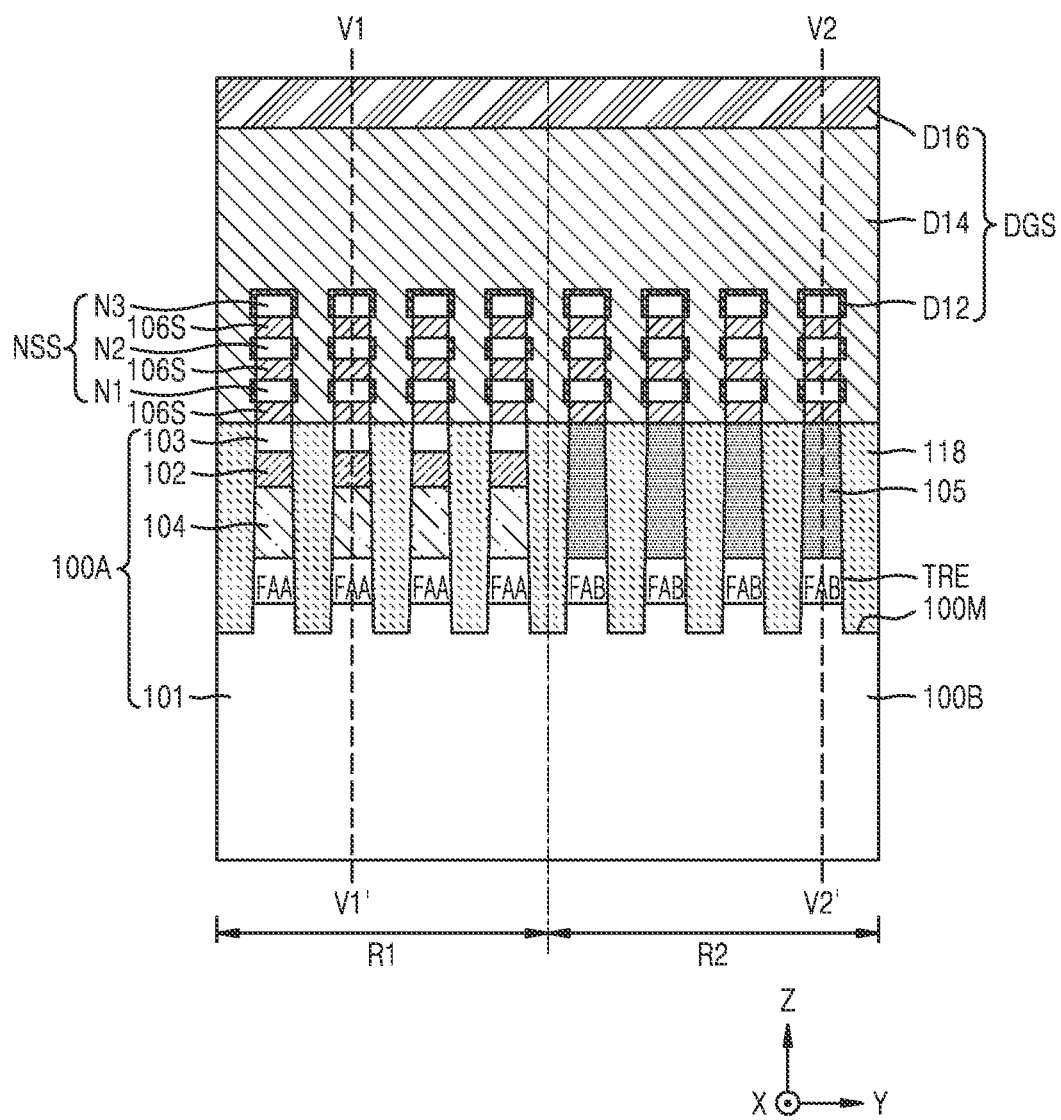
Figure 8B:
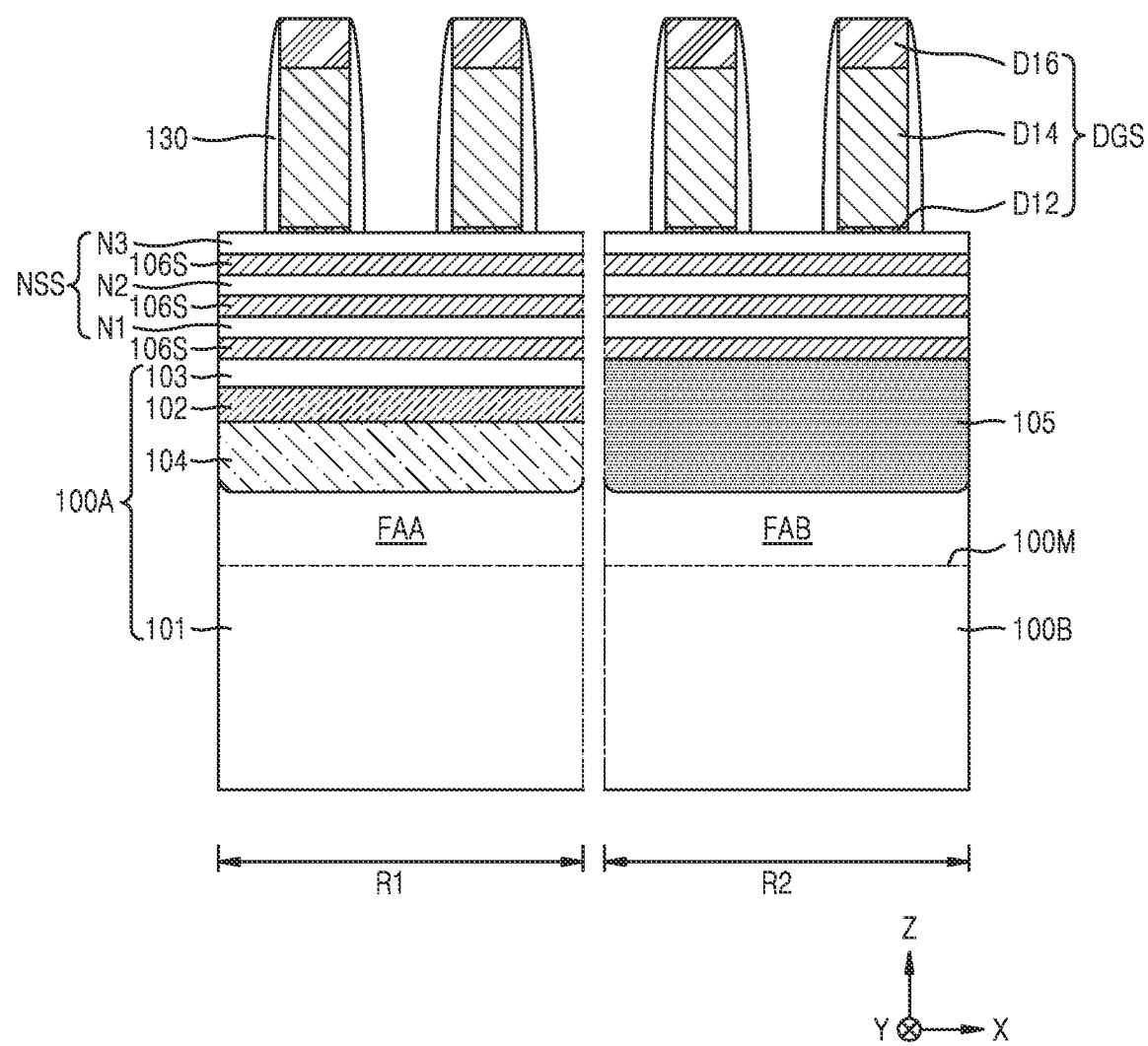

Referring to FIGS. 8A and 8B, in the first region R1 and the second region R2, a plurality of dummy gate structures DGS may be formed that cross at least portions of the plurality of first fin-type active areas FAA and the plurality of second fin-type active areas FAB and extending on the stacked structure NSS of the plurality of nanosheets N1, N2, and N3, and the plurality of first fin-type active areas FAA and the plurality of second fin-type active areas FAB. The plurality of dummy gate structures DGS may extend in parallel with each other in the second horizontal direction (Y direction).

The dummy gate structure DGS may have a structure in which an oxide layer D12, a dummy gate layer D14, and a capping layer D16 are sequentially stacked. In an example for forming the dummy gate structure DGS, the oxide layer D12, the dummy gate layer D14, and the capping layer D16 may be formed and patterned such that only some portions of the oxide layer D12, the dummy gate layer D14, and the capping layer D16 remain, such that the oxide layer D12, the dummy gate layer D14, and the capping layer D16 cover exposed surfaces of the stacked structure NSS and the plurality of sacrificial semiconductor layers 106S that cover upper portions of the plurality of first fin-type active areas FAA and the plurality of second fin-type active areas FAB, exposed surfaces of the plurality of first fin-type active areas FAA and the plurality of second fin-type active areas FAB, and an exposed upper surface of the device separating layer 118.

In some embodiments, the dummy gate layer D14 may include a polysilicon layer, and the capping layer D16 may include a silicon nitride layer, but the present disclosure is not limited thereto.

A gate spacer 130 may be formed to cover both side walls of the dummy gate structure DGS. For forming the gate spacer 130, a spacer layer covering the dummy gate structure DGS may be formed, and then the spacer layer may be etched back so that the gate spacer 130 remains. The gate spacer 130 may include, for example, a silicon nitride layer.

Figure 9:
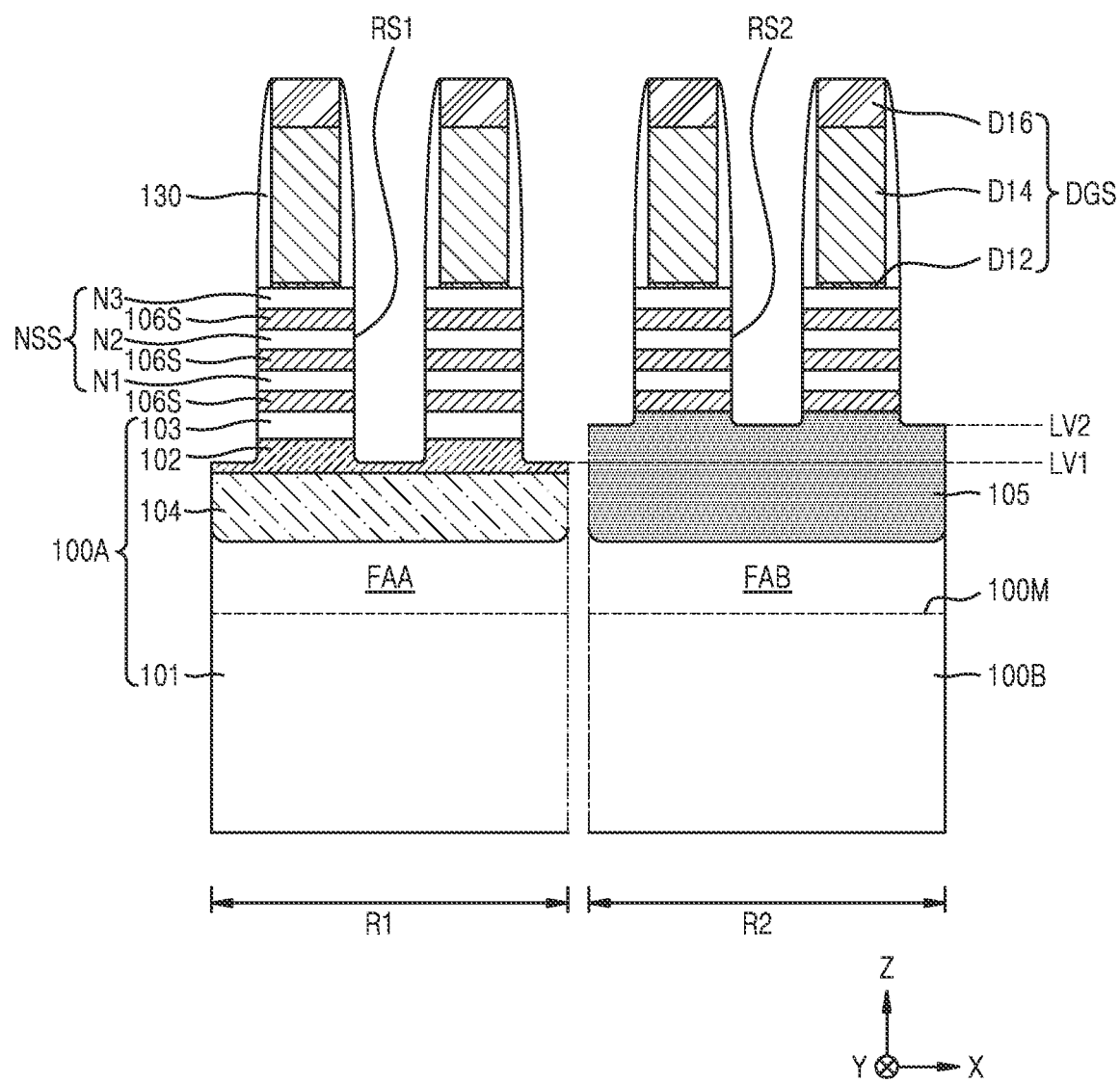

Referring to FIG. 9, a plurality of first recess regions RS1 and a plurality of second recess regions RS2 may be formed in the first region R1 and the second region R2, respectively, by removing portions of the stacked structure NSS of the plurality of nanosheets N1, N2, and N3 and the plurality of sacrificial semiconductor layers 106S by using the dummy gate structure DGS and the gate spacer 130 as etching masks.

In some embodiments, in the process of etching portions of the plurality of nanosheets N1, N2, and N3 and the plurality of sacrificial semiconductor layers 106S for forming the plurality of first recess regions RS1 and the plurality of second recess regions RS2, some of the upper portions of the first fin-type active areas FAA and the plurality of second fin-type active areas FAB may also be removed. For example, each of the plurality of first recess regions RS1 may penetrate the cover substrate layer 103 and may extend into the insulating substrate layer 102. Each of the plurality of second recess regions RS2 may extend into the semiconductor substrate layer 100B.

In some embodiments, each of the plurality of first recess regions RS1 may extend into the insulating substrate layer 102, and the insulating substrate layer 102 may be exposed by the first recess regions RS1. In some embodiments, each of the plurality of second recess regions RS2 may extend into the semiconductor substrate layer 100B, and the second impurity region 105 may be exposed by the plurality of second recess regions RS2. A bottom of the first recess region RS1 may be at a first vertical level LV1, and a bottom of the second recess region RS2 may be at a second vertical level LV2 that is higher than the first vertical level LV1. The second vertical level LV2 may be farther than the first vertical level LV1 from the main surface 100M of the substrate that includes the SOI substrate layer 100A and the semiconductor substrate layer 100B.

Figure 10:
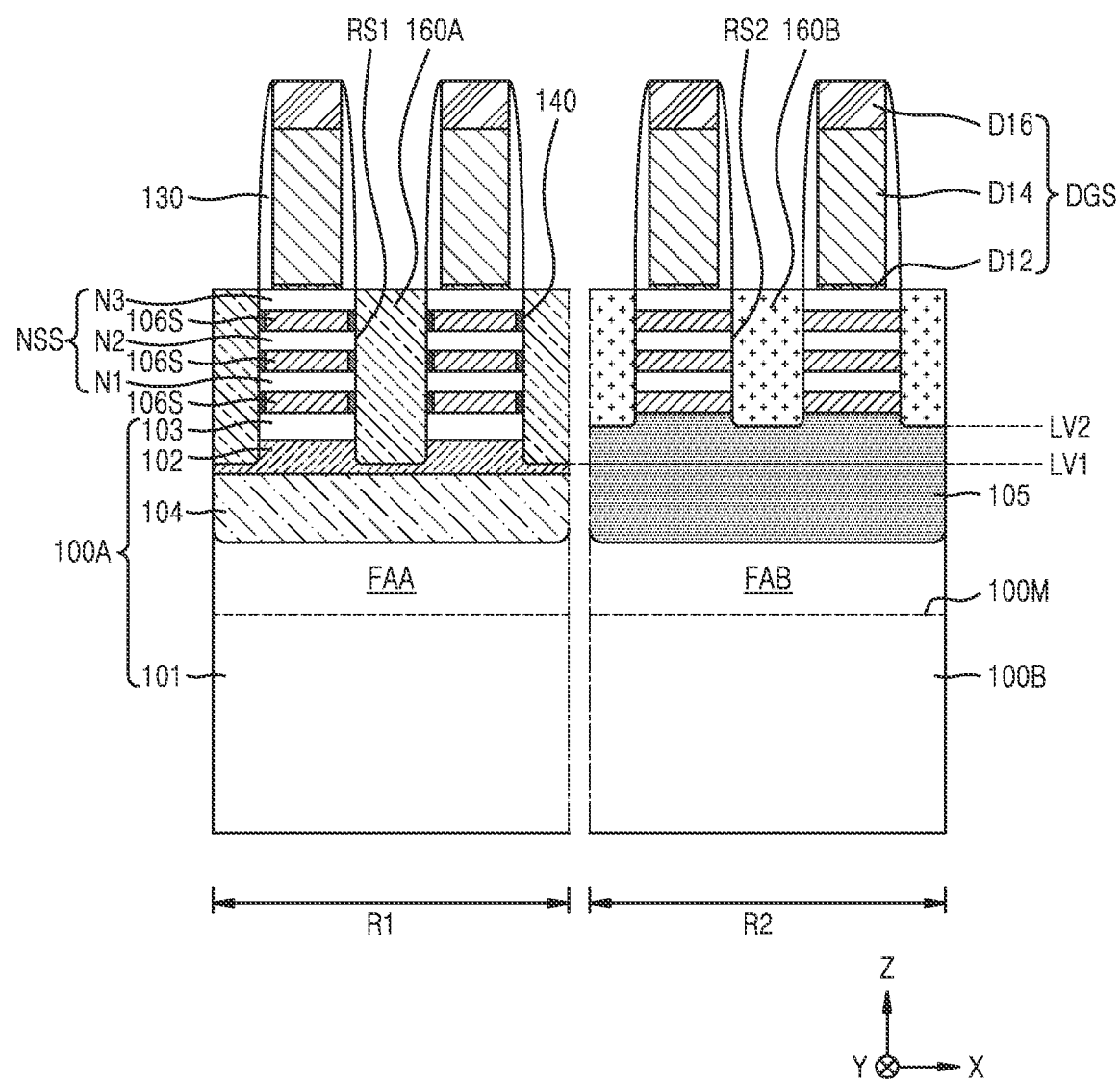

Referring to FIG. 10, portions of the plurality of sacrificial semiconductor layers 106S exposed to both sides of each of the plurality of nanosheets N1, N2, and N3 in the plurality of first recess regions RS1 may be removed by using an isotropic etching process in the first region R1. Thereafter, insulating spacers 140 may be formed that fill some of the areas between each of the plurality of nanosheets N1, N2 resulting from the isotropic etching process. The insulating spacers 140 may include, for example, silicon nitride layers. In some embodiments, each insulating spacer 140 may be formed by stacking a plurality of insulating layers. In some embodiments, the insulating spacers 140 may be formed only in the first region R1, and may not be formed in the second region R2.

After the insulating spacers 140 are formed in the first region R1, a plurality of first source/drain regions 160A and a plurality of second source/drain regions 160B may be formed in the first region R1 and the second region R2, respectively. The plurality of first source/drain regions 160A and the plurality of second source/drain regions 160B may include a semiconductor material formed by using an epitaxial growth method using as seeds the exposed side walls of the plurality of nanosheets N1, N2, and N3 and the exposed surfaces of the first fin-type active areas FAA and the plurality of second fin-type active areas FAB. For example, the plurality of first source/drain regions 160A may be formed by using an epitaxial growth method using as seeds the cover substrate layer 103 and the stacked structure NSS of the plurality of nanosheets N1, N2, and N3. The plurality of second source/drain regions 160B may be formed by using an epitaxial growth method using as seeds the semiconductor substrate layer 100B and the stacked structure NSS of the plurality of nanosheets N1, N2, and N3.

In some embodiments, the plurality of first source/drain regions 160A and the plurality of second source/drain regions 160B may include different materials from each other, and each of the plurality of first source/drain regions 160A and the plurality of second source/drain regions 160B may be formed by performing separate epitaxial growth methods. For example, the first source/drain regions 160A may include Si, but not Ge. In some embodiments, the plurality of first source/drain regions 160A may include a semiconductor material such as Si, a compound semiconductor material such SiC, or a multi-layer structure thereof. The second source/drain region 160B may include Ge. In some embodiments, the second source/drain regions 160B may include a semiconductor material such as Ge, a compound semiconductor material such as SiGe, a multi-layer structure thereof, or a semiconductor material such as Si, and a multi-layer structure thereof.

The plurality of first source/drain regions 160A may fill portions of the plurality of first recess regions RS1, and each of the plurality of first source/drain regions 160A may extend into the insulating substrate layer 102, and a lower surface of each of the plurality of first source/drain regions 160A may contact the insulating substrate layer 102. The plurality of second source/drain regions 160B may fill portions of the plurality of second recess regions RS2, each of the plurality of second source/drain regions 160B may extend into the semiconductor substrate layer 100B, and a lower surface of each of the plurality of second source/drain regions 160B may contact the second impurity region 105. The lower surface of the first source/drain region 160A may be at the first vertical level LV1, and the lower surface of the second source/drain region 160B may be at the second vertical level LV2 that is higher than the first vertical level LV1, or farther from the main surface 100M.

Figure 11:
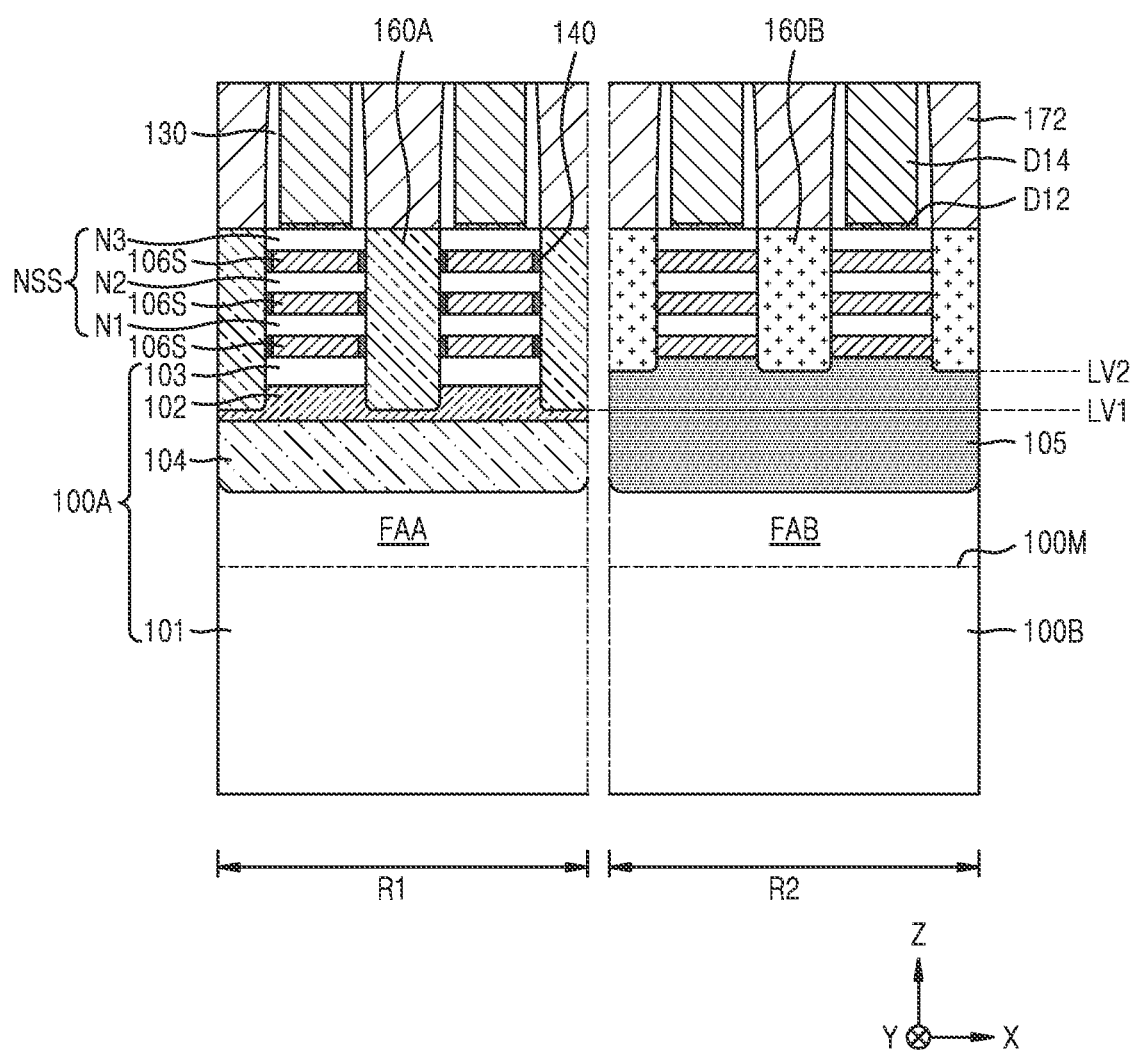

Referring to FIGS. 10 and 11, an inter-gate insulating layer 172 may be formed on the plurality of first source/drain regions 160A, the plurality of second source/drain regions 160B, the plurality of dummy gate structures DGS, and the plurality of dummy gate structures DGS. Thereafter, portions of the inter-gate insulating layer 172 and the capping layer D16 covering an upper surface of the dummy gate layer D14 may be removed by planarizing the inter-gate insulating layer 172, and/or grinding the gate spacer 130 and the inter-gate insulating layer 172 around the capping layer D16 by a certain thickness from upper portions of the gate spacer 130 and the inter-gate insulating layer 172. As a result, an upper surface of the inter-gate insulating layer 172 may be at an approximately identical level to the upper surface of the dummy gate layer D14. In some embodiments, the inter-gate insulating layer 172 may include silicon oxide layer.

Figure 12:
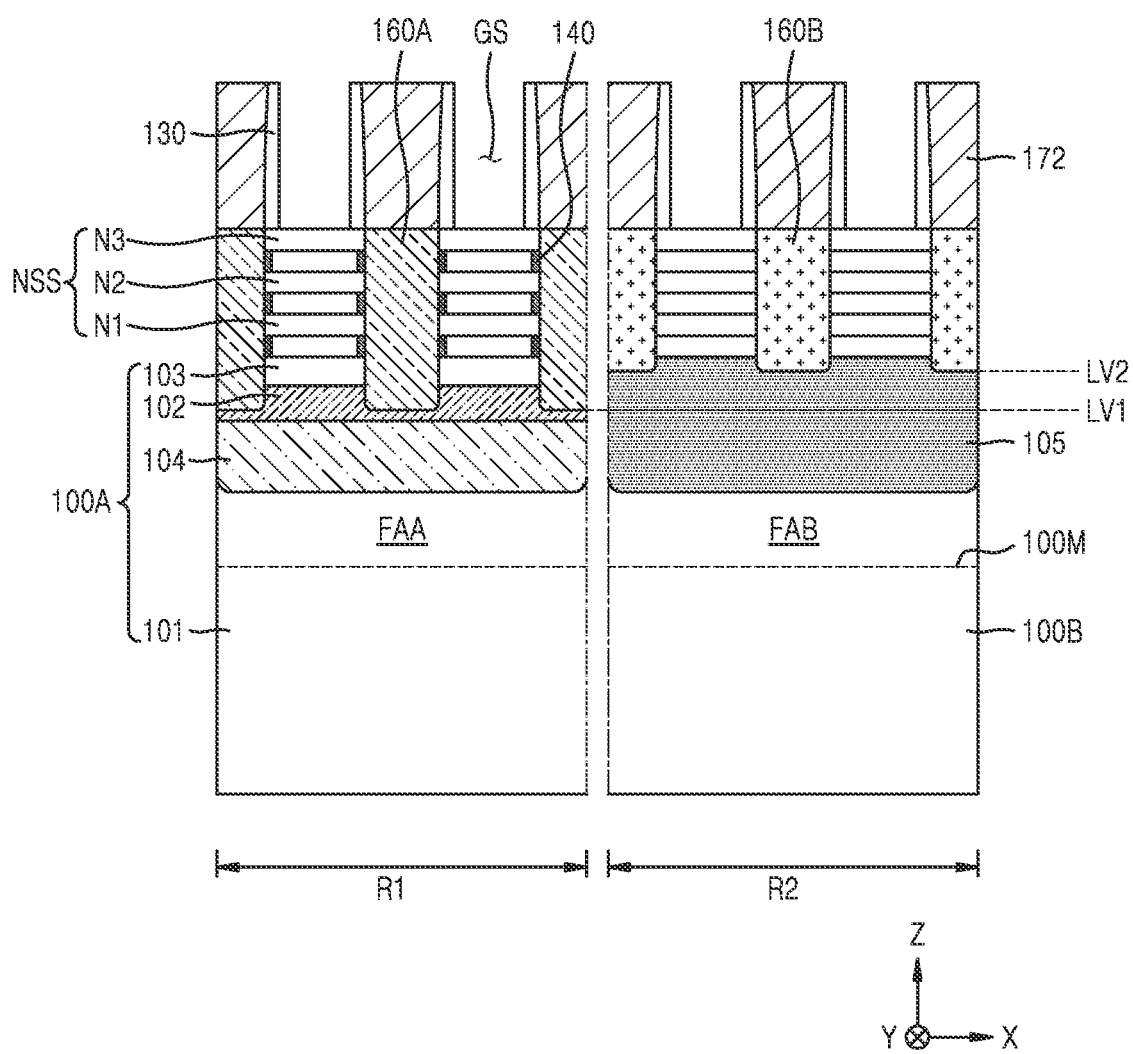

Referring to FIGS. 11 and 12, a plurality of gate spaces GS may be formed, by removing the dummy gate layer D14 and the oxide layer D12 thereunder from between the inter-gate insulating layer 172 and the gate spacer 130, and by removing at least some of the plurality of sacrificial semiconductor layers 106S remaining in the first region R1 and the second region R2. A portion of each of the surfaces of the plurality of nanosheets N1, N2, and N3, the upper surfaces of the plurality of first fin-type active areas FAA, and the upper surfaces of the plurality of second fin-type active areas FAB may be exposed via the gate spaces GS. In some embodiments, some portions of the plurality of sacrificial semiconductor layers 106S may not be removed and instead remain.

Figure 13:
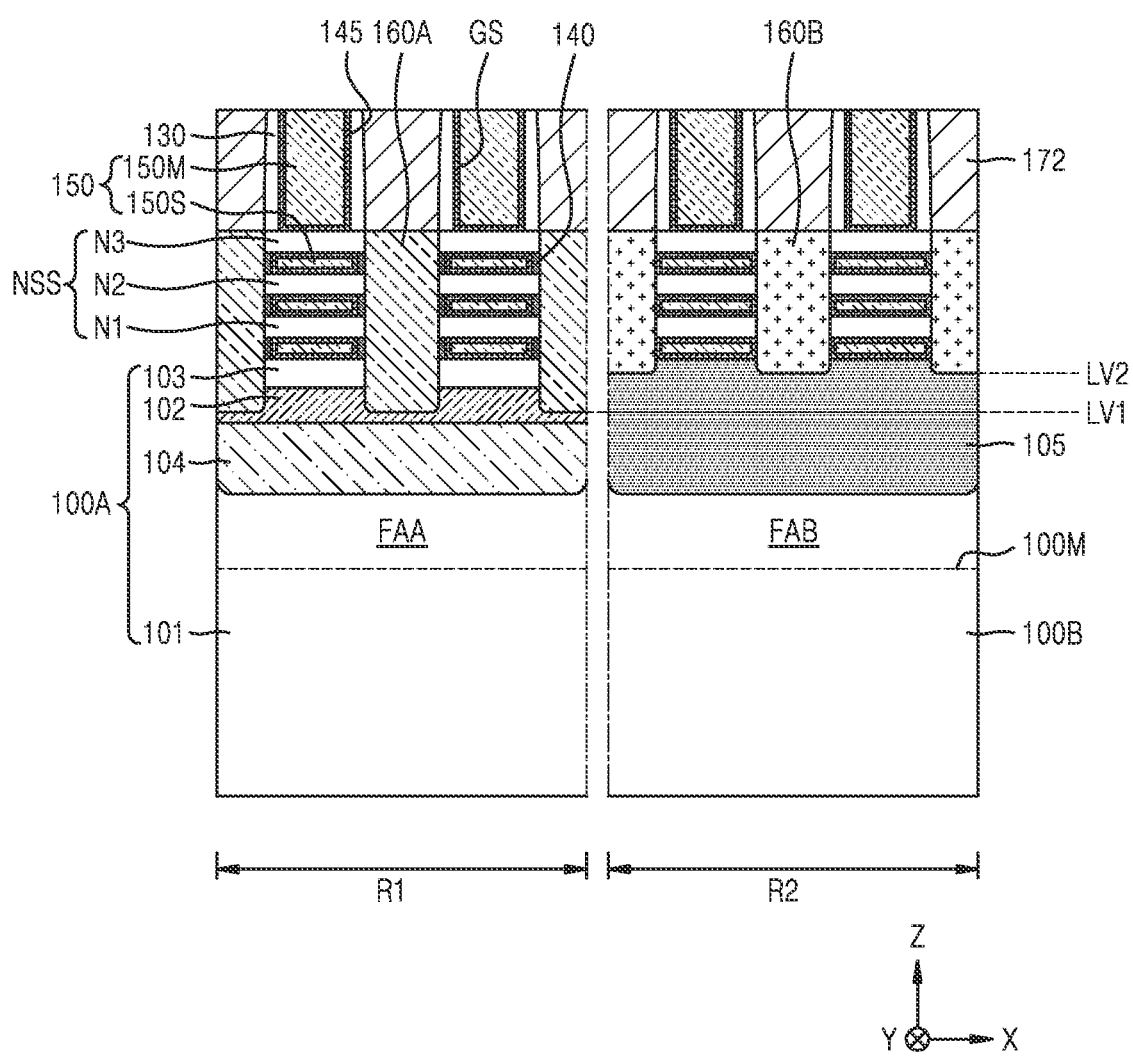

Referring to FIGS. 12 and 13, a gate dielectric layer 145 may be formed on surfaces exposed by the plurality of gate spaces GS, and a plurality of gate electrodes 150 may be formed on the gate dielectric layer 145 that fill the plurality of gate spaces GS. The plurality of gate electrodes 150 may extend in parallel with each other in the second horizontal direction (Y direction).

In some embodiments, the gate dielectric layer 145 may have a stacked structure of an interfacial layer and a high-k dielectric layer. In some embodiments, the interface layer may include a low dielectric material layer having a dielectric constant of about 9 or less, such as a silicon oxide layer, a silicon oxynitride film, or a combination thereof, as non-limiting examples. In some embodiments, the interface layer may be omitted. The high-k dielectric layer may include a material having a dielectric constant greater than that of the silicon oxide layer. For example, the high-k dielectric layer may have a dielectric constant of about 10 to about 25.

In some embodiments, the gate dielectric layer 145 may include a ferroelectric material layer having a ferroelectric characteristic, and a paraelectric material layer having a paraelectric characteristic. The ferroelectric material layer may have a negative capacitance, and the paraelectric material layer may have a positive capacitance. For example, when two or more capacitors are connected in series, and each of capacitances of the capacitors has a positive value, the total capacitance may be decreased from each of capacitances of individual capacitors. However, when the capacitance of at least one of the two or more capacitors connected to each other in series has a negative value, the total capacitance may be positive and greater than an absolute value of each of individual capacitances.

When the ferroelectric material layer having a negative capacitance and a paraelectric material layer having a positive capacitance are connected to each other in series, the total capacitance value of the ferroelectric material layer and the paraelectric material layer connected to each other in series may be increased. Because the total capacitance value may be increased, a transistor including the ferroelectric material layer may have a subthreshold swing (SS) less than about 60 mV/decade at room temperature.

The ferroelectric material layer may have a ferroelectric characteristic. The ferroelectric material layer may include at least one of hafnium oxide, hafnium zirconium oxide, barium strontium titanium oxide, barium titanium oxide, and lead zirconium titanium oxide. In some embodiments, for example, the hafnium zirconium oxide may include hafnium oxide with zirconium (Zr) doped thereon. As another example, the hafnium zirconium oxide may be a compound of hafnium (Hf), zirconium (Zr), and oxygen (O).

The ferroelectric material layer may further include doped dopant. As non-limiting examples, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). Depending on which ferroelectric material is included in the ferroelectric material layer, a type of the dopant included in the ferroelectric material layer may vary.

When the ferroelectric material layer includes a hafnium oxide, the dopant included in the ferroelectric material layer may include at least one of, as non-limiting examples, gadolinium (Gd), silicon (Si), zirconium (Zr), aluminum (Al), and/or yttrium (Y).

When the dopant is Al, the ferroelectric material layer may include aluminum of about 3 to about 8 at %. For example, a ratio of the dopant may be a ratio of aluminum over a sum of hafnium and aluminum.

When the dopant is Si, the ferroelectric material layer may include silicon of about 2 to 10 at %. When the dopant is Y, the ferroelectric material layer may include yttrium of about 2 to 10 at %. When the dopant is Gd, the ferroelectric material layer may include gadolinium of about 1 to 7 at %. When the dopant is Zr, the ferroelectric material layer may include zirconium of about 50 to 80 at %.

The paraelectric material layer may have a paraelectric characteristic. The paraelectric material layer may include at least one of silicon oxide and a metal oxide of a high-k. The metal oxide included in the paraelectric material layer may include at least one of hafnium oxide, zirconium oxide, and aluminum oxide, but the present disclosure is not limited thereto.

The ferroelectric material layer and the paraelectric material layer may include the same material as each other. The ferroelectric material layer may not have a paraelectric characteristic, and the paraelectric material layer may not have a ferroelectric characteristic. For example, when the ferroelectric material layer and the paraelectric material layer include hafnium oxide, a crystal structure of the hafnium oxide included in the ferroelectric material layer may be different from that of the hafnium oxide included in the paraelectric material layer.

The ferroelectric material layer may have a thickness having a ferroelectric characteristic. The thickness of the ferroelectric material layer may be, for example, about 0.5 nm to about 10 nm, but the present disclosure is not limited thereto. Because a critical thickness of the ferroelectric material showing a ferroelectric characteristic may vary, the thickness of the ferroelectric material layer may vary depending on the selected ferroelectric material.

As an example, the gate dielectric layer 145 may include one ferroelectric material layer. As another example, the gate dielectric layer 145 may include a plurality of ferroelectric material layers spaced apart from each other. The gate dielectric layer 145 may have a stacked layer structure in which the plurality of ferroelectric material layers and the plurality of paraelectric material layers are stacked alternately.

The gate electrode 150 may include a work function control metal-including layer and a gap-fill metal-including layer that fills an upper space of the work function control metal-including layer. In some embodiments, the gate electrode 150 may have a structure in which a metal nitride layer, a metal layer, a conductive capping layer, and a gap-fill metal layer are sequentially stacked.

The gate electrode 150 may include a main gate unit 150M that covers the upper surface of the nanosheet stacked structure NSS including the plurality of nanosheets N1, N2, and N3, and a plurality of sub-gate units 150S that are connected to the main gate unit 150M and formed in a space between each of the plurality of nanosheets N1, N2, and N3 and the first fin-type active area FAA, and a space between each of the plurality of nanosheets N1, N2, and N3 and the second fin-type active area FAB. For example, the sub-gate units 150S may be formed under each of the plurality of nanosheets N1, N2, and N3.

In the first region R1, the plurality of insulating spacers 140 may be arranged with the gate dielectric layer 145 therebetween on both ends of each of the plurality of sub-gate units 150S. In the second region R2, the plurality of second source/drain regions 160B may be arranged with the gate dielectric layer 145 therebetween on both ends of each of the plurality of sub-gate units 150S. In the first region R1, the gate dielectric layer 145 and the insulating spacer 140 may be arranged between the sub-gate unit 150S and the first source/drain region 160A. In the second region R2, the gate dielectric layer 145 may be present, but the insulating spacer 140 may be absent from between the sub-gate unit 150S and the second source/drain region 160B. Accordingly, in the second region R2, the sub-gate unit 150S and the second source/drain region 160B may directly contact the gate dielectric layer 145 that is arranged therebetween.

Figure 14A:
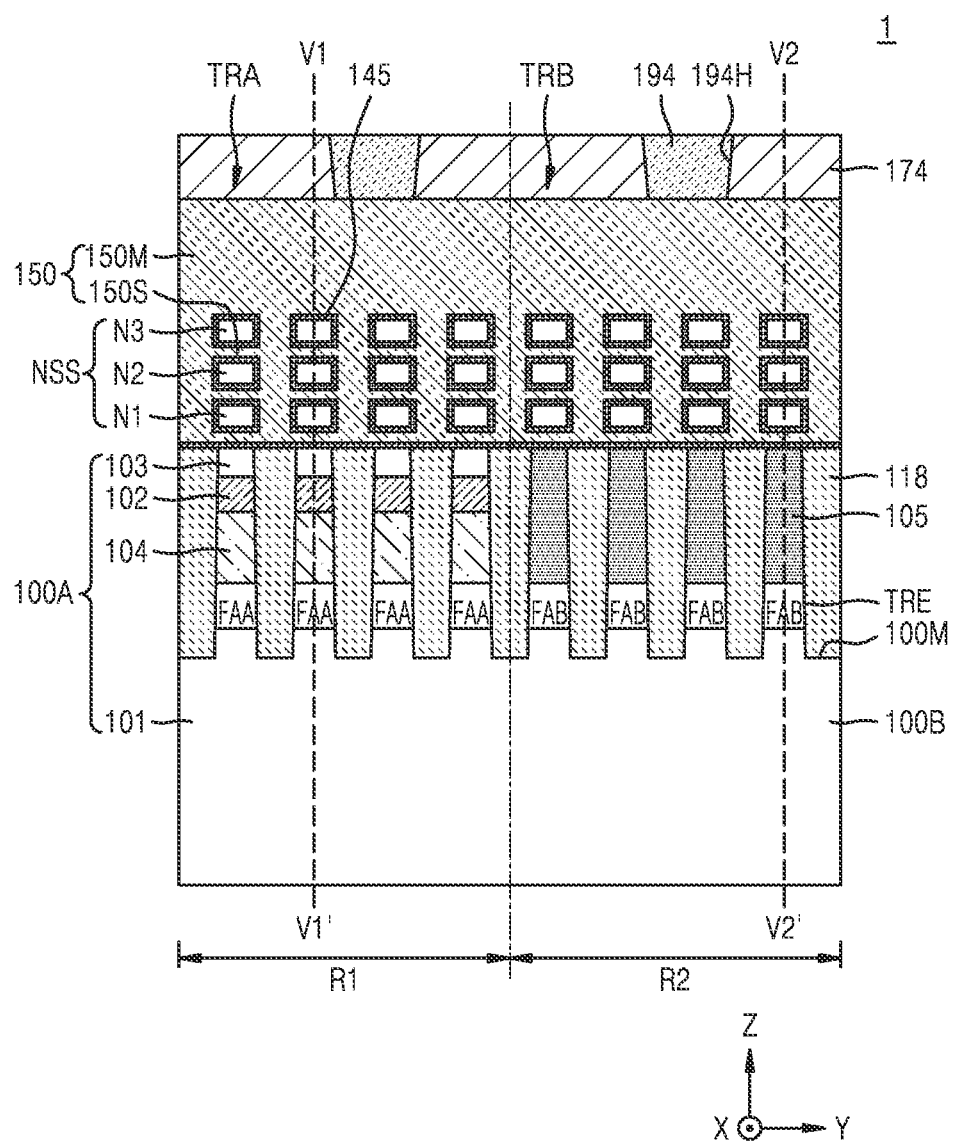
Figure 14B:
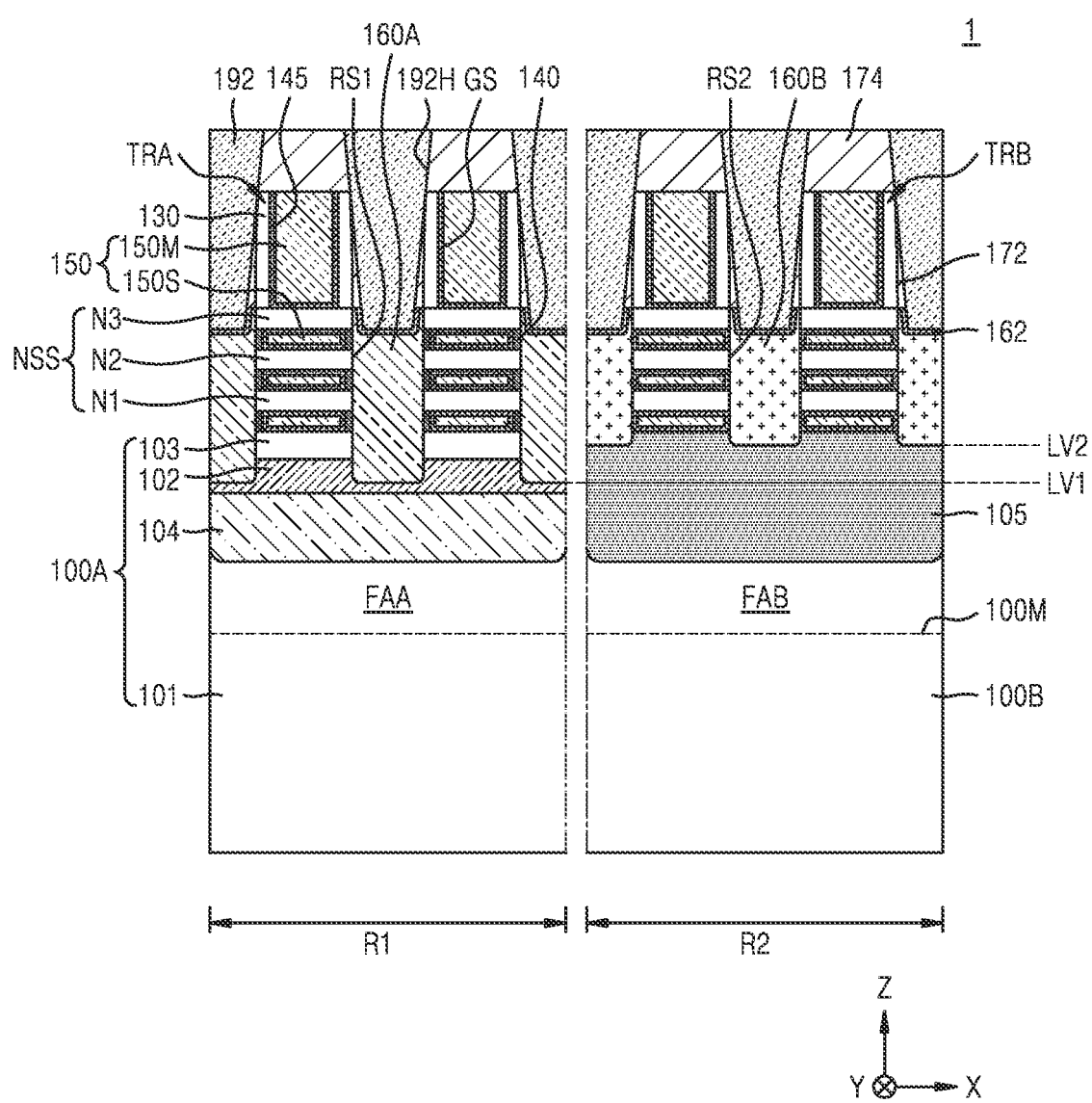

Referring to FIGS. 14A and 14B, an inter-layer insulating layer 174 that covers the plurality of gate electrodes 150 and the inter-gate insulating layer 172 may be formed, and thereafter a first contact hole 192H that exposes the plurality of first source/drain regions 160A and the plurality of second source/drain regions 160B may be formed by etching some of the inter-layer insulating layer 174 and the inter-gate insulating layer 172. A metal silicide layer 162 may be formed on surfaces of the plurality of first source/drain regions 160A and the plurality of second source/drain regions 160B that are exposed via a plurality of first contact holes 192H. In addition, by etching a portion of the inter-layer insulating layer 174, a plurality of second contact holes 194H may be formed that expose upper surfaces of the plurality of gate electrodes 150, that is, an upper surface of the main gate unit 150M. In some embodiments, the plurality of first contact holes 192H and the plurality of second contact holes 194H may be formed together in a single etching process, but the present disclosure is not limited thereto, and each of the plurality of first contact holes 192H and the plurality of second contact holes 194H may be formed by separate etching processes.

Thereafter, a plurality of first contact plugs 192 may be formed that fill the plurality of first contact holes 192H and a plurality of second contact plugs 194 may be formed that fill the plurality of second contact holes 194H, and as a result the integrated circuit device 1 may be formed.

The plurality of first contact plugs 192 may be connected to the plurality of first source/drain regions 160A and the plurality of second source/drain regions 160B via the metal silicide layer 162, and the plurality of second contact plugs 194 may be connected to the plurality of gate electrodes 150. In some embodiments, the plurality of first contact plugs 192 and the plurality of second contact plugs 194 may be formed together, but the present disclosure is not limited thereto, and each of the plurality of first contact plugs 192 and the plurality of second contact plugs 194 may be formed in separate processes.

The integrated circuit device 1 may include the plurality of first fin-type active areas FAA and the plurality of second fin-type active areas FAB that protrude upward in the vertical direction (Z direction) from the main surface 100M of the substrate including the SOI substrate layer 100A and the semiconductor substrate layer 100B, and may also include the plurality of nanosheet stacked structures NSS that the upper surfaces of the plurality of first fin-type active areas FAA and the plurality of second fin-type active areas FAB from a location spaced apart in the vertical direction (Z direction) from the upper surfaces of the plurality of first fin-type active areas FAA and the plurality of second fin-type active areas FAB. The plurality of first fin-type active areas FAA may protrude upward in the vertical direction (Z direction) from the main surface 100M of the SOI substrate layer 100A in the first region R1, and the plurality of second fin-type active areas FAB may protrude upward in the vertical direction (Z direction) from the main surface 100M of the semiconductor substrate layer 100B in the second region R2.

The plurality of trenches TRE may limit or define the plurality of first fin-type active areas FAA and the plurality of second fin-type active areas FAB on the substrate including the SOI substrate layer 100A and the semiconductor substrate layer 100B. Side walls of the plurality of first fin-type active areas FAA and the plurality of second fin-type active areas FAB may be covered by a device separating layer 118 that fills the plurality of trenches TRE. Levels of surfaces of the plurality of first fin-type active areas FAA and the plurality of second fin-type active areas FAB may be from the main surface 100M at the same level as or at a similar level as a level of an upper surface of the device separating layer 118.

The plurality of nanosheet stacked structures NSS may be spaced apart from the upper surfaces of the plurality of first fin-type active areas FAA and the plurality of second fin-type active areas FAB. The plurality of nanosheet stacked structures NSS may include the plurality of nanosheets N1, N2, and N3 that extend in parallel with the upper surfaces of the plurality of first fin-type active areas FAA and the plurality of second fin-type active areas FAB on the substrate including the SOI substrate layer 100A and the semiconductor substrate layer 100B.

The plurality of nanosheets N1, N2, and N3 of one nanosheet stacked structure NSS may be sequentially stacked one-by-one on the upper surfaces of the plurality of first fin-type active areas FAA and the plurality of second fin-type active areas FAB. In some embodiments, one nanosheet stacked structure NSS includes three nanosheets N1, N2, and N3 as illustrated, but the present disclosure is not limited thereto. Each of the plurality of nanosheets N1, N2, and N3 may each have a channel region. In some embodiments, the plurality of nanosheets N1, N2, and N3 may include a single material.

The plurality of gate electrodes 150 may extend in the second horizontal direction (Y direction) that crosses the first horizontal direction (X direction), and may extend on the plurality of first fin-type active areas FAA and the plurality of second fin-type active areas FAB. At least a portion of the plurality of gate electrodes 150 may overlap each of the plurality of nanosheet stacked structures NSS in the vertical direction (Z direction).

Each of the plurality of gate electrodes 150 may cover the nanosheet stacked structure NSS, and surround at least a portion of the plurality of nanosheet stacked structures NSS. The gate electrode 150 may include the main gate unit 150M that covers the upper surface of the nanosheet stacked structure NSS, and the plurality of sub-gate units 150S connected to the main gate unit 150M and formed in spaces between the plurality of first fin-type active areas FAA and the plurality of second fin-type active areas FAB and each of the plurality of nanosheets N1, N2, and N3, that is, under each of the plurality of nanosheets N1, N2, and N3. The gate dielectric layer 145 may separate the nanosheet stacked structure NSS and the gate electrode 150.

In the first region R1, the plurality of first source/drain regions 160A may be formed on the plurality of first fin-type active areas FAA, and in the second region R2, the plurality of second source/drain regions 160B may be formed on the plurality of second fin-type active areas FAB. Each of the plurality of first source/drain regions 160A and the plurality of second source/drain regions 160B may be connected to adjacent ends of the plurality of nanosheets N1, N2, and N3. In the first region R1, each of the plurality of first source/drain regions 160A may extend into the SOI substrate layer 100A. In some embodiments, in the first region R1, each of the plurality of first source/drain regions 160A may penetrate the cover substrate layer 103, and extend into the insulating substrate layer 102, and the lower surface of each of the plurality of first source/drain regions 160A may contact the insulating substrate layer 102. In the first region R1, each of the plurality of first source/drain regions 160A may not contact the first impurity region 104. In the second region R2, each of the plurality of second source/drain regions 160B may extend into the semiconductor substrate layer 100B, and the lower surface of each of the plurality of second source/drain regions 160B may contact the second impurity region 105. The lower surface of the first source/drain region 160A may be at the first vertical level LV1, and the lower surface of the second source/drain region 160B may be at the second vertical level LV2 that is higher than the first vertical level LV1 and farther from the main surface 100M.

The integrated circuit device 1 may include a plurality of first transistors TRA equipped in the first region R1, and a plurality of second transistors TRB equipped in the second region R2. Each of the first transistor TRA and the second transistor TRB may be or may include a multi-gate metal-oxide-semiconductor field effect transistor (MOSFET). In some embodiments, the first transistor TRA equipped in the first region R1 may include a multi-gate nMOSFET, and the second transistor TRB equipped in the second region R2 may include a multi-gate pMOSFET.

In some embodiments, when the gate dielectric layer 145 includes the ferroelectric material layer having a ferroelectric characteristic and the paraelectric material layer having a paraelectric characteristic, each of the first transistor TRA and the second transistor TRB may include a negative capacitance (NC) FET using a negative capacitor.

The gate spacer 130 sequentially covering side walls of the gate electrode 150 may be formed on the plurality of nanosheet stacked structures NSS, the plurality of first fin-type active areas FAA, and the plurality of second fin-type active areas FAB. The gate spacer 130 may include a silicon nitride layer, but the present disclosure is not limited thereto. The gate spacer 130 may cover side walls of the main gate unit 150M of the gate electrode 150.

In the first region R1, the insulating spacer 140 may contact the first source/drain region 160A and may be formed in a space between each of the plurality of nanosheets N1, N2, and N3. The insulating spacer 140 may be arranged between the sub-gate unit 150S and the first source/drain region 160A in a space between each of the plurality of first fin-type active areas FAA and the plurality of nanosheets N1, N2, and N3. In the second region R2, the insulating spacer 140 may not be formed, and the second source/drain region 160B may contact the gate dielectric layer 145.

The inter-gate insulating layer 172 and the inter-layer insulating layer 174 may be sequentially formed on the plurality of first source/drain regions 160A and the plurality of second source/drain regions 160B. Each of the inter-gate insulating layer 172 and the inter-layer insulating layer 174 may include a silicon oxide layer, but the present disclosure is not limited thereto.

The plurality of first contact plugs 192 may be connected to the plurality of first source/drain regions 160A and the plurality of second source/drain regions 160B. The plurality of first contact plugs 192 may penetrate the inter-layer insulating layer 174 and the inter-gate insulating layer 172, and may be connected to the plurality of first source/drain regions 160A and the plurality of second source/drain regions 160B. The metal silicide layer 162 may be arranged between the plurality of first source/drain regions 160A and the plurality of second source/drain regions 160B, and the first contact plug 192. In some embodiments, the metal silicide layer 162 may be omitted.

The plurality of second contact plugs 194 may be connected to the plurality of gate electrodes 150. The second contact plug 194 may penetrate the inter-layer insulating layer 174, and may be connected to the gate electrode 150.

Each of the first contact plug 192 and the second contact plug 194 may include metal, conductive metal nitride, or a combination thereof.

In the integrated circuit device 1 according to the inventive concepts, each of the plurality of first transistors TRA formed in the first region R1 may be formed on the SOI substrate layer 100A including the base substrate layer 101, the insulating substrate layer 102, and the cover substrate layer 103, which are sequentially stacked, and each of the plurality of second transistors TRB formed in the second region R2 may be formed on the semiconductor substrate layer 100B.

Because the first transistor TRA is separated from the first impurity region 104 by the insulating substrate layer 102, an off-state leakage current of the first transistor TRA may not occur in the first transistor TRA. Accordingly, because the off-state leakage current of the plurality of first transistors TRA is at least reduced, an operation characteristic of the integrated circuit device 1 according to the inventive concepts may be improved. An on-state current of the first transistor TRA may be formed by using not only the stacked structure of the plurality of nanosheets N1, N2, and N3, but also the cover substrate layer 103 separated from the first impurity region 104 by the insulating substrate layer 102. Accordingly, because the on-state current of the plurality of first transistors TRA is increased, output characteristics of the integrated circuit device 1 according to the inventive concepts may be improved.

In addition, in the second region R2, the plurality of second source/drain regions 160B of the plurality of second transistors TRB are formed by using an epitaxial growth method using as seeds the semiconductor substrate layer 100B in which the second impurity region 105 is formed and also the nanosheet stacked structure NSS of the plurality of nanosheets N1, N2, and N3, and thus, the plurality of second source/drain regions 160B may have good crystallization. Accordingly, operation characteristics of the plurality of second transistors TRB may be improved.

Therefore, the integrated circuit device 1 according to the inventive concepts may include the plurality of first fin-type active areas FAA and the plurality of second fin-type active areas FAB, in which the operation characteristics are improved, and thus, may secure reliability and the improved operation characteristics.

FIGS. 15 through 19 are cross-sectional views of integrated circuit devices, according to some embodiments. Duplicate descriptions given with reference to FIGS. 1 through 14B are omitted from descriptions of FIGS. 15 through 19. FIGS. 15 through 19 are cross-sectional views illustrating X-Z surfaces.

Figure 15:
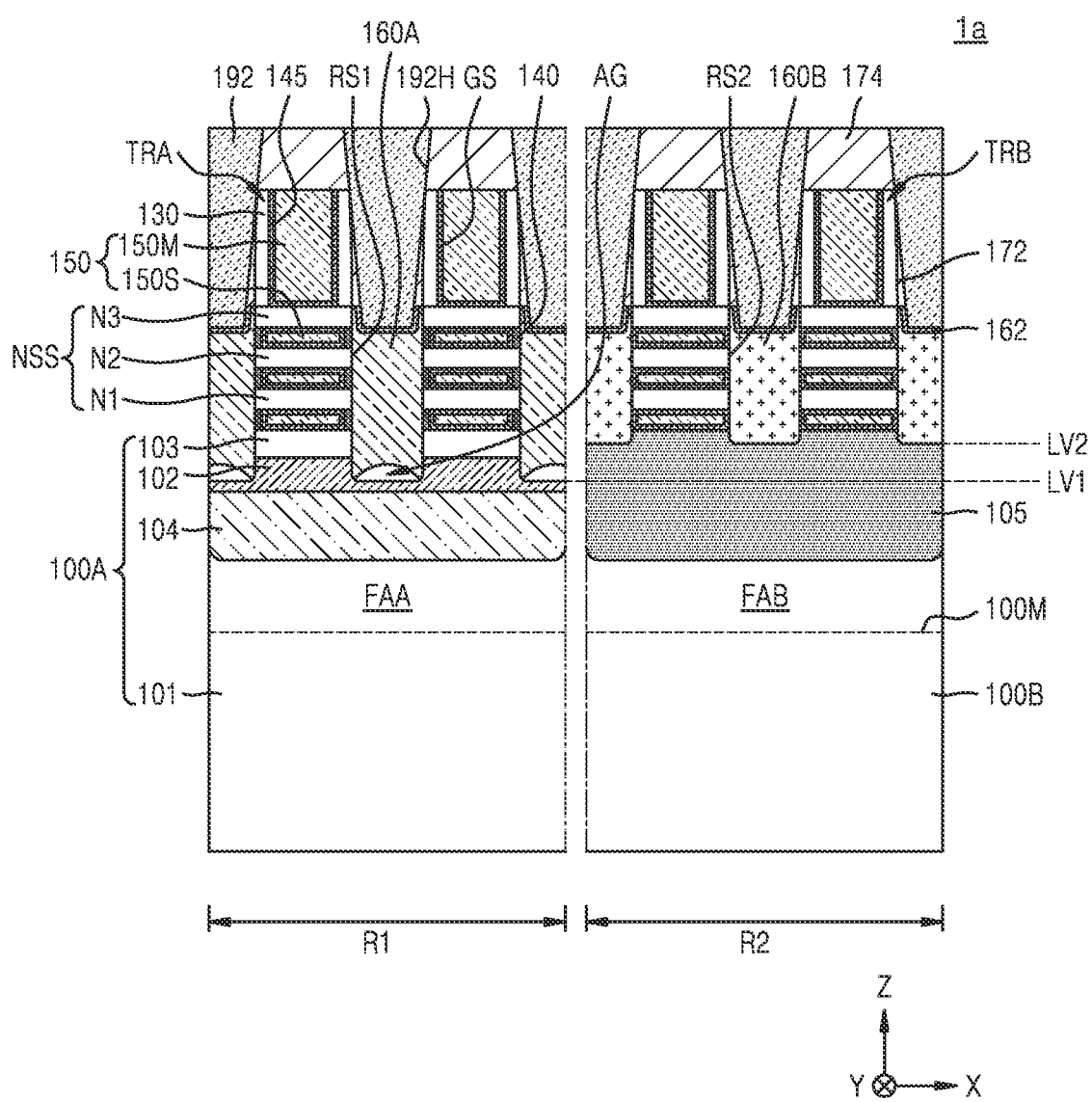
FIGS. 15 through 19 are cross-sectional views of integrated circuit devices, according to some embodiments.

Referring to FIG. 15, an integrated circuit device 1a may include the plurality of first transistors TRA equipped in the first region R1, and the plurality of second transistors TRB equipped in the second region R2. Each of the first transistor TRA and the second transistor TRB may include a multi-gate MOSFET.

The integrated circuit device 1a may include the plurality of first fin-type active areas FAA and the plurality of second fin-type active areas FAB that protrude upward in the vertical direction (Z direction) from the main surface 100M of the substrate including the SOI substrate layer 100A and the semiconductor substrate layer 100B, and the plurality of nanosheet stacked structures NSS that face the upper surfaces of the plurality of first fin-type active areas FAA and the plurality of second fin-type active areas FAB from locations spaced apart from the plurality of first fin-type active areas FAA and the plurality of second fin-type active areas FAB.

The plurality of nanosheet stacked structures NSS may be spaced apart from the upper surfaces of the plurality of first fin-type active areas FAA and the plurality of second fin-type active areas FAB. The plurality of nanosheet stacked structures NSS may include the plurality of nanosheets N1, N2, and N3 that extend in parallel with the upper surfaces of the plurality of first fin-type active areas FAA and the plurality of second fin-type active areas FAB on the substrate including the SOI substrate layer 100A and the semiconductor substrate layer 100B.

The plurality of gate electrodes 150 may extend in the second horizontal direction (Y direction) that cross the first horizontal direction (X direction), and may extend on the plurality of first fin-type active areas FAA and the plurality of second fin-type active areas FAB. The gate electrode 150 may include the main gate unit 150M that covers the upper surface of the nanosheet stacked structure NSS, and the plurality of sub-gate units 150S that are connected to the main gate unit 150M and formed in spaces between the plurality of first fin-type active areas FAA and the plurality of second fin-type active areas FAB and the plurality of nanosheets N1, N2, and N3, that is, under each of the plurality of nanosheets N1, N2, and N3. The gate dielectric layer 145 may separate the nanosheet stacked structure NSS and the gate electrode 150.

In the first region R1, the plurality of first source/drain regions 160A may be formed on the plurality of first fin-type active areas FAA, and in the second region R2, the plurality of second source/drain regions 160B may be formed on the plurality of second fin-type active areas FAB.

The integrated circuit device 1a may include an air gap AG arranged between each of the plurality of first source/drain regions 160A and the insulating substrate layer 102. In FIG. 15, the air gap AG is illustrated to be arranged at the lower surface of the first recess region RS1, but this is only exemplary, and the present disclosure is not limited thereto. For example, the air gap AG may be arranged between each of the plurality of first source/drain regions 160A and the insulating substrate layer 102 across the lower surface and lower side walls of the first recess region RS1. Because the air gap AG reduces parasite capacitance, the operation characteristic of the integrated circuit device 1a may be improved.

The gate spacer 130 sequentially covering side walls of the gate electrode 150 may be formed on the plurality of nanosheet stacked structures NSS, the plurality of first fin-type active areas FAA, and the plurality of second fin-type active areas FAB.

In the first region R1, the insulating spacer 140 that contacts the first source/drain region 160A may be formed in the space between each of the plurality of nanosheets N1, N2, and N3. In the second region R2, the insulating spacer 140 may not be formed, and the second source/drain region 160B may contact (e.g., directly contact) the gate dielectric layer 145.

The inter-gate insulating layer 172 and the inter-layer insulating layer 174 may be sequentially formed on the plurality of first source/drain regions 160A and the plurality of second source/drain regions 160B. The plurality of first contact plugs 192 may be connected to the plurality of first source/drain regions 160A and the plurality of second source/drain regions 160B. The plurality of first contact plugs 192 may penetrate the inter-layer insulating layer 174 and the inter-gate insulating layer 172, and may be connected to the plurality of first source/drain regions 160A and the plurality of second source/drain regions 160B. The metal silicide layer 162 may be arranged between the plurality of first source/drain regions 160A and the plurality of second source/drain regions 160B, and the first contact plug 192.

The plurality of second contact plugs 194 may be connected to the plurality of gate electrodes 150, as illustrated in FIG. 14A.

Figure 16:
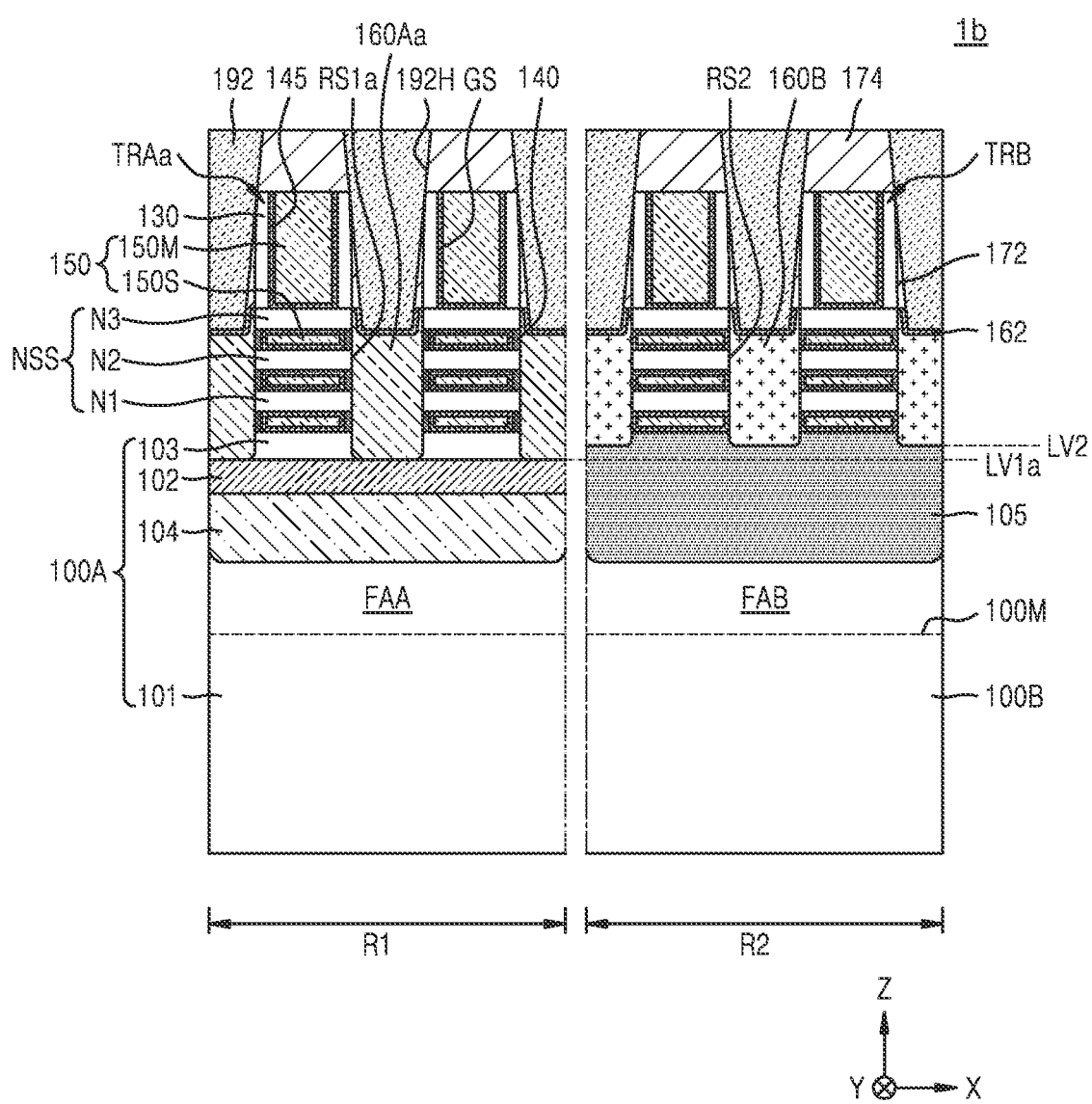

Referring to FIG. 16, an integrated circuit device 1b may include the plurality of first transistors TRAa equipped in the first region R1, and the plurality of second transistors TRB equipped in the second region R2. Each of the first transistor TRAa and the second transistor TRB may include the multi-gate MOSFET.

The integrated circuit device 1b may include the plurality of first fin-type active areas FAA and the plurality of second fin-type active areas FAB that protrude upward in the vertical direction (Z direction) from the main surface 100M of the substrate including the SOI substrate layer 100A and the semiconductor substrate layer 100B, and the plurality of nanosheet stacked structures NSS that face the upper surfaces of the plurality of first fin-type active areas FAA and the plurality of second fin-type active areas FAB from locations spaced apart from the plurality of first fin-type active areas FAA and the plurality of second fin-type active areas FAB.

The plurality of nanosheet stacked structures NSS may be apart from the upper surfaces of the plurality of first fin-type active areas FAA and the plurality of second fin-type active areas FAB. The plurality of nanosheet stacked structures NSS may include the plurality of nanosheets N1, N2, and N3 that extend in parallel with the upper surfaces of the plurality of first fin-type active areas FAA and the plurality of second fin-type active areas FAB on the substrate including the SOI substrate layer 100A and the semiconductor substrate layer 100B.

The plurality of gate electrodes 150 may extend in the second horizontal direction (Y direction) that cross the first horizontal direction (X direction), and may extend on the plurality of first fin-type active areas FAA and the plurality of second fin-type active areas FAB. The gate electrode 150 may include the main gate unit 150M that covers the upper surface of the nanosheet stacked structure NSS, and the plurality of sub-gate units 150S that are connected to the main gate unit 150M and formed in spaces between the plurality of first fin-type active areas FAA and the plurality of second fin-type active areas FAB and the plurality of nanosheets N1, N2, and N3, that is, under each of the plurality of nanosheets N1, N2, and N3. The gate dielectric layer 145 may separate the nanosheet stacked structure NSS and the gate electrode 150.

In the first region R1, the plurality of first source/drain regions 160Aa may be formed on the plurality of first fin-type active areas FAA, and in the second region R2, the plurality of second source/drain regions 160B may be formed on the plurality of second fin-type active areas FAB. Each of the plurality of first source/drain regions 160Aa and the plurality of second source/drain regions 160B may be connected to adjacent ends of the plurality of nanosheets N1, N2, and N3. In the first region R1, the plurality of first source/drain regions 160Aa may fill a plurality of first recess regions RS1a, and extend into the SOI substrate layer 100A. In some embodiments, in the first region R1, each of the plurality of first source/drain regions 160Aa may penetrate the cover substrate layer 103, but may not extend into the insulating substrate layer 102, and the lower surface of each of the plurality of first source/drain regions 160Aa may contact the insulating substrate layer 102. In the first region R1, each of the plurality of first source/drain regions 160Aa may not contact the first impurity region 104. In the second region R2, the plurality of second source/drain region 160B may fill the plurality of second recess region RS2 and extend into the semiconductor substrate layer 100B, and the lower surface of the plurality of second source/drain region 160B may contact the lower surface of the second impurity region 105. The lower surface of the first source/drain region 160Aa may be at a first vertical level LV1a, and the lower surface of the second source/drain region 160B may be at the second vertical level LV2 that is higher than the first vertical level LV1a.

The gate spacer 130 sequentially covering side walls of the gate electrode 150 may be formed on the plurality of nanosheet stacked structures NSS, the plurality of first fin-type active areas FAA, and the plurality of second fin-type active areas FAB.

In the first region R1, the insulating spacer 140 that contacts the first source/drain region 160Aa may be formed in the space between each of the plurality of nanosheets N1, N2, and N3. In the second region R2, the insulating spacer 140 may not be formed, and the second source/drain region 160B may contact (e.g., directly contact) the gate dielectric layer 145.

The inter-gate insulating layer 172 and the inter-layer insulating layer 174 may be sequentially formed on the plurality of first source/drain regions 160Aa and the plurality of second source/drain regions 160B. The plurality of first contact plugs 192 may be connected to the plurality of first source/drain regions 160Aa and the plurality of second source/drain regions 160B. The plurality of first contact plugs 192 may penetrate the inter-layer insulating layer 174 and the inter-gate insulating layer 172, and may be connected to the plurality of first source/drain regions 160Aa and the plurality of second source/drain regions 160B. The metal silicide layer 162 may be arranged between the plurality of first source/drain regions 160Aa and the plurality of second source/drain regions 160B, and the first contact plug 192.

Figure 17:
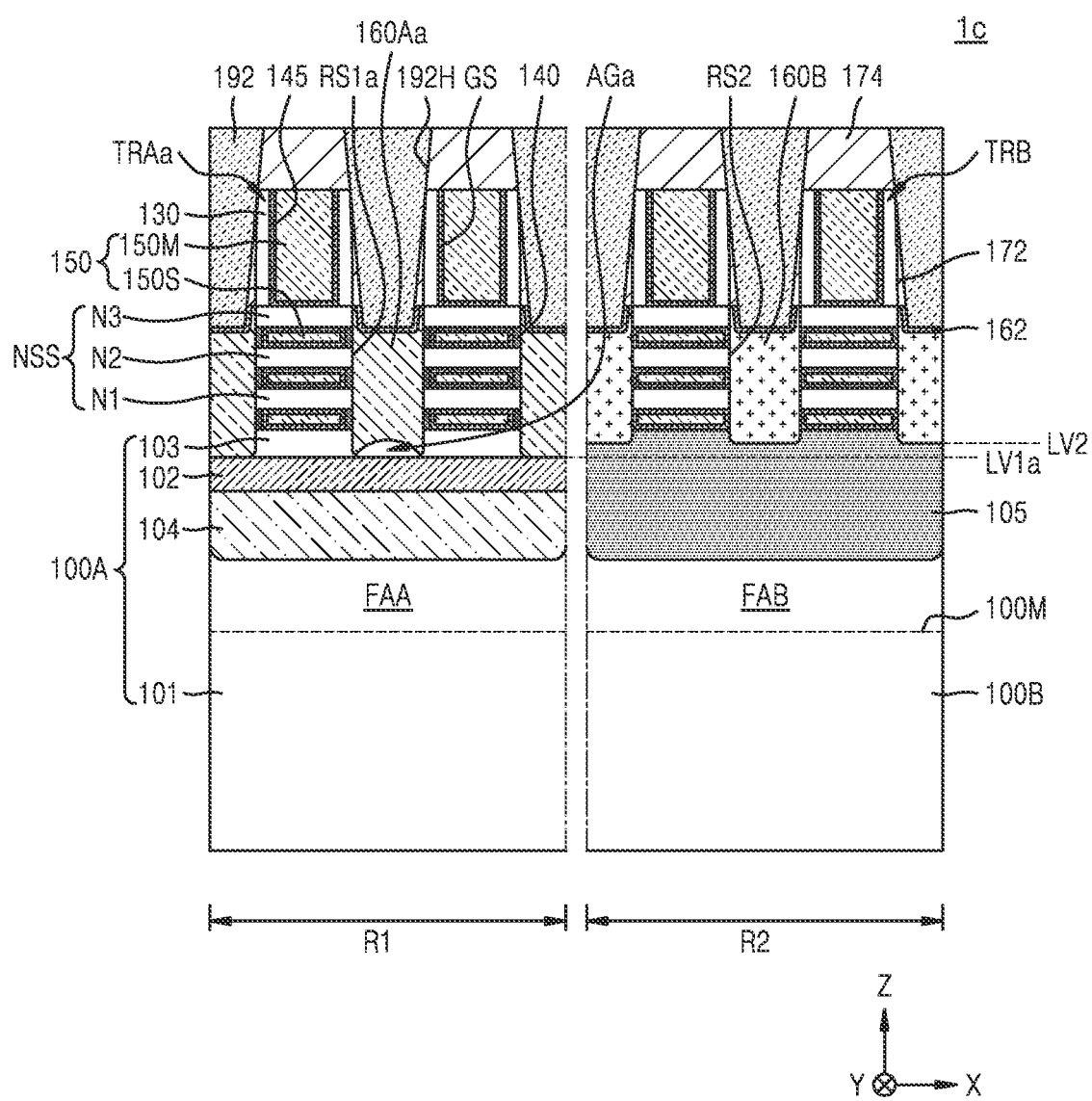

Referring to FIG. 17, in the integrated circuit device 1b illustrated in FIG. 16, all of the lower surfaces of the plurality of first source/drain regions 160Aa may contact the upper surface of the insulating substrate layer 102 on the lower surface of the first recess region RS1a, but an integrated circuit device 1c as illustrated in FIG. 17 may include an air gap AGa arranged between each of the plurality of first source/drain regions 160Aa and the insulating substrate layer 102. For example, the air gap AGa may be arranged between each of the plurality of first source/drain region 160Aa and the insulating substrate layer 102, across the lower surface of a first recess region RS1a. Because the air gap AGa reduces parasite capacitance, the operation characteristic of the integrated circuit device 1c may be improved.

Figure 18:
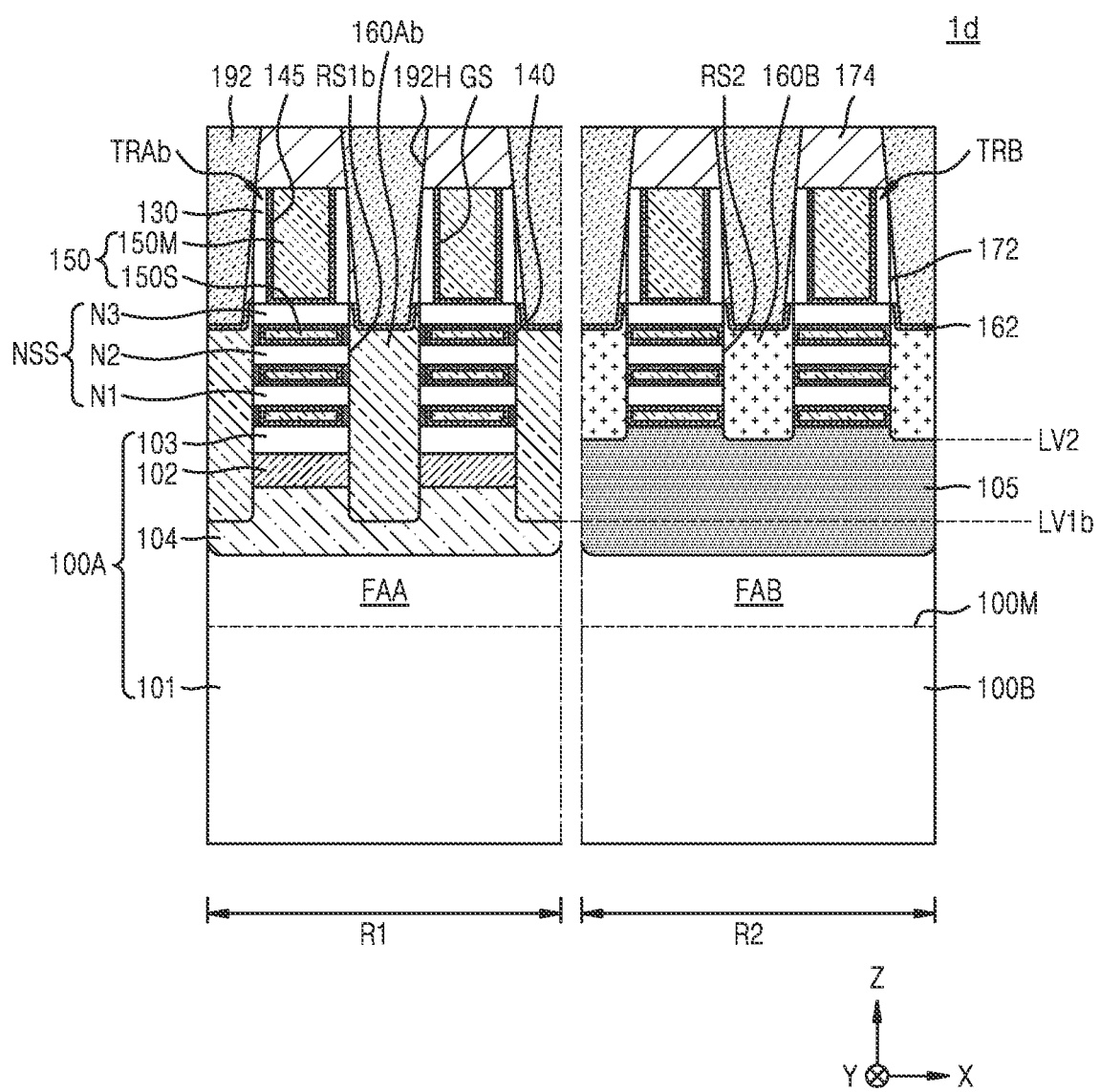

Referring to FIG. 18, an integrated circuit device 1d may include the plurality of first transistors TRAb equipped in the first region R1, and the plurality of second transistors TRB equipped in the second region R2. Each of the first transistor TRAb and the second transistor TRB may include the multi-gate MOSFET.

The integrated circuit device 1d may include a plurality of first source/drain regions 160Ab and the plurality of second source/drain regions 160B. In the first region R1, the plurality of first source/drain regions 160Ab may be formed on the plurality of first fin-type active areas FAA, and in the second region R2, the plurality of second source/drain regions 160B may be formed on the plurality of second fin-type active areas FAB. Each of the plurality of first source/drain regions 160Ab and the plurality of second source/drain regions 160B may be connected to adjacent ends of the plurality of nanosheets N1, N2, and N3. In the first region R1, the plurality of first source/drain regions 160Ab may fill a plurality of first recess regions RS1b, and extend into the SOI substrate layer 100A. In some embodiments, in the first region R1, each of the plurality of first source/drain regions 160Ab may penetrate both the cover substrate layer 103 and the insulating substrate layer 102, and extend into the first impurity region 104 of the base substrate layer 101. A lower surface of each of the plurality of first source/drain regions 160Ab may contact the base substrate layer 101. In the first region R1, each of the plurality of first source/drain regions 160Ab may contact the first impurity region 104. In the second region R2, the plurality of second source/drain regions 160B may fill the plurality of second recess regions RS2 and extend into the semiconductor substrate layer 100B, and the lower surface of the plurality of second source/drain regions 160B may contact the lower surface of the second impurity region 105. The lower surface of the first source/drain region 160Ab may be at a first vertical level LV1b, and the lower surface of the second source/drain region 160B may be at the second vertical level LV2 that is higher than the first vertical level LV1b, or farther from the main surface 100M.

In the first region R1, the insulating spacer 140 contacting the first source/drain region 160Ab may be formed in the space between each of the plurality of nanosheets N1, N2, and N3. In the second region R2, the insulating spacer 140 may not be formed, and the second source/drain region 160B may contact (e.g., directly contact) the gate dielectric layer 145.

Figure 19:
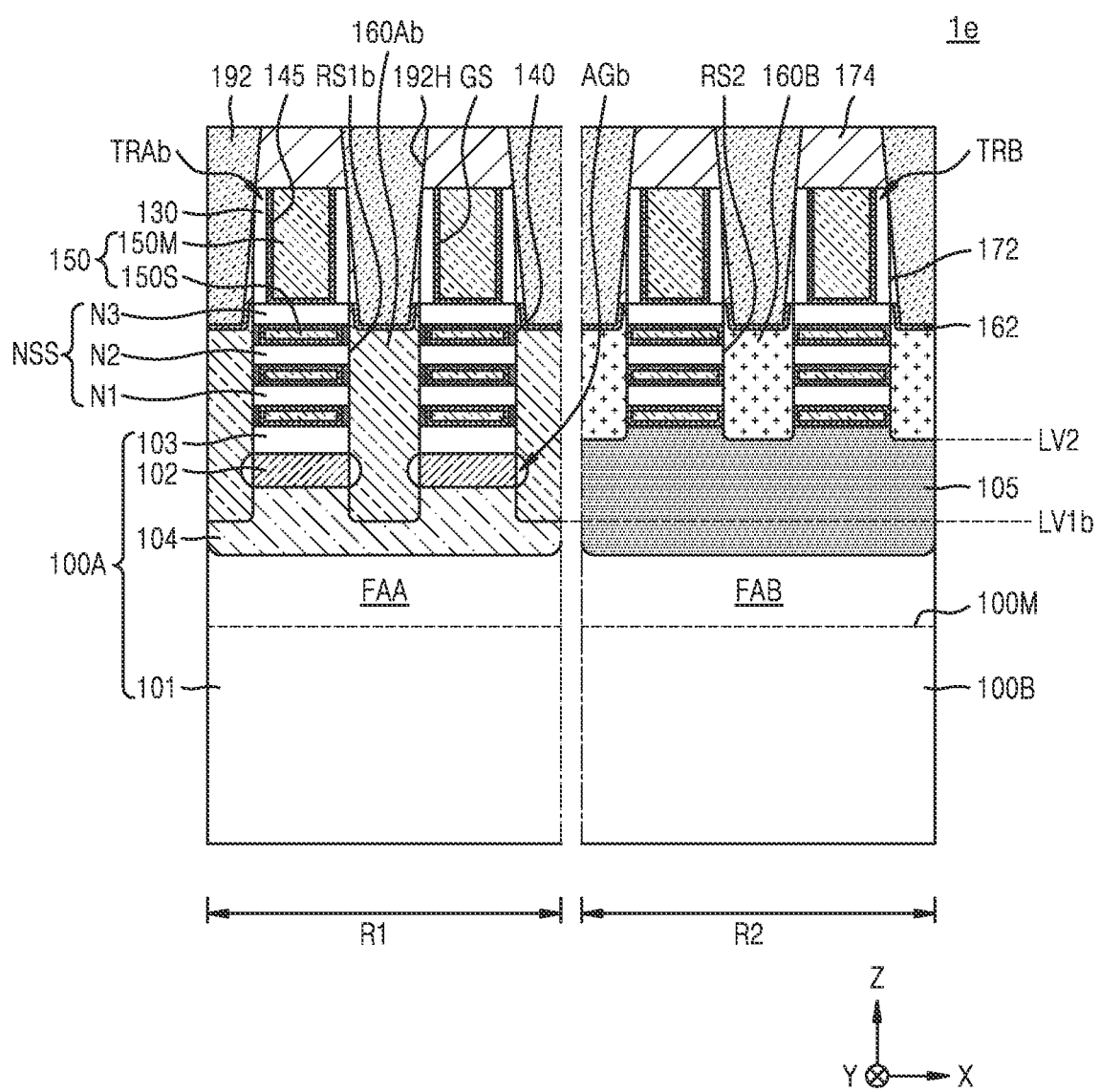

Referring to FIG. 19, in the integrated circuit device 1d illustrated in FIG. 18, the plurality of first source/drain regions 160Ab may contact all the side surfaces of the insulating substrate layer 102 on the side surfaces of the first recess region RS1b, but an integrated circuit device 1e as illustrated in FIG. 19 may include an air gap AGb arranged between each of the plurality of first source/drain regions 160Ab and the insulating substrate layer 102. For example, the air gap AGb may be arranged between each of the plurality of first source/drain region 160Ab and the insulating substrate layer 102, on the sides of the first recess region RS1b. Because the air gap AGb reduces parasite capacitance, an operation characteristic of the integrated circuit device 1e may be improved.

Figure 20A:
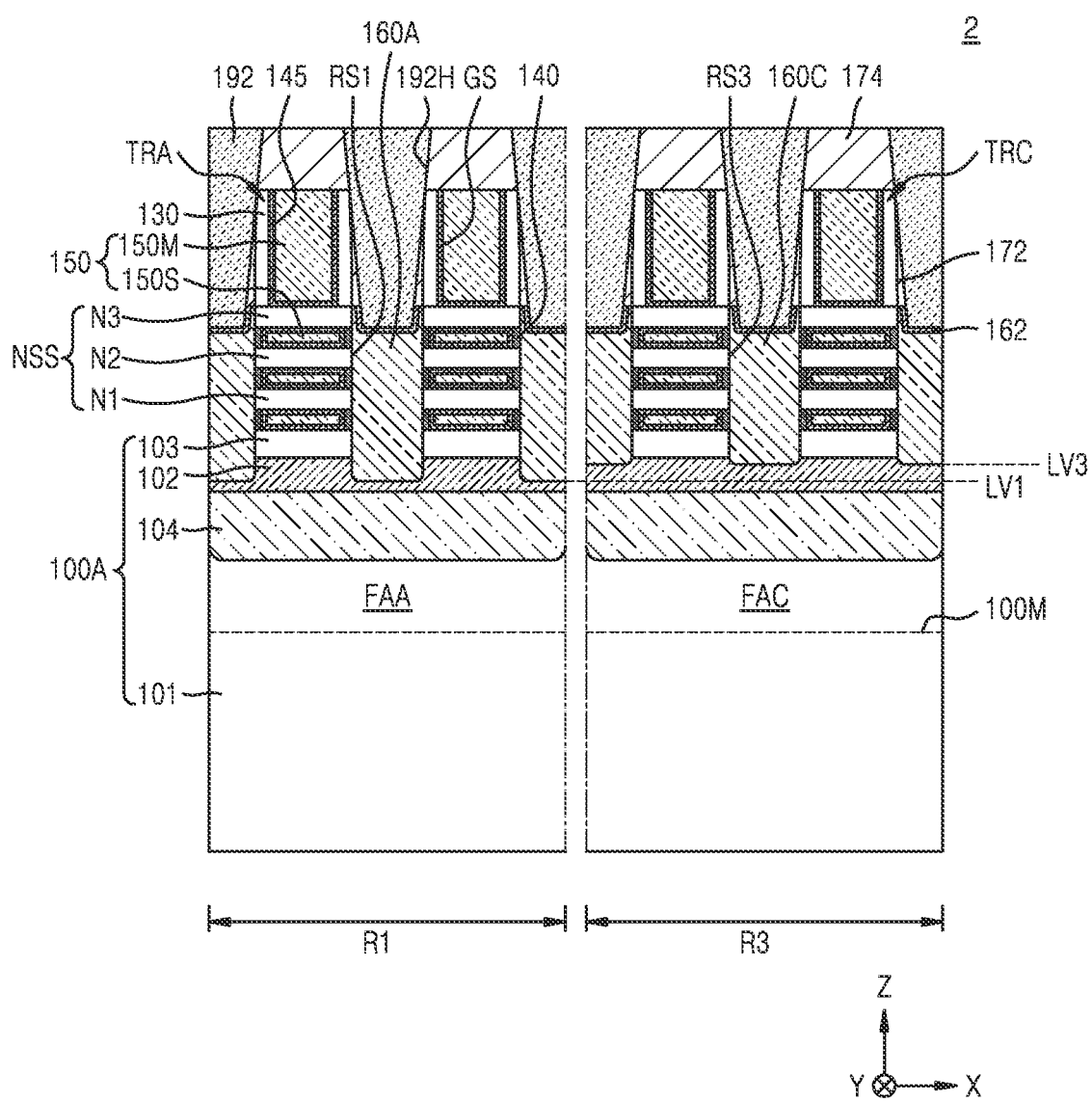
FIGS. 20A and 20B are cross-sectional views of integrated circuit devices, according to some embodiments.
Figure 20B:
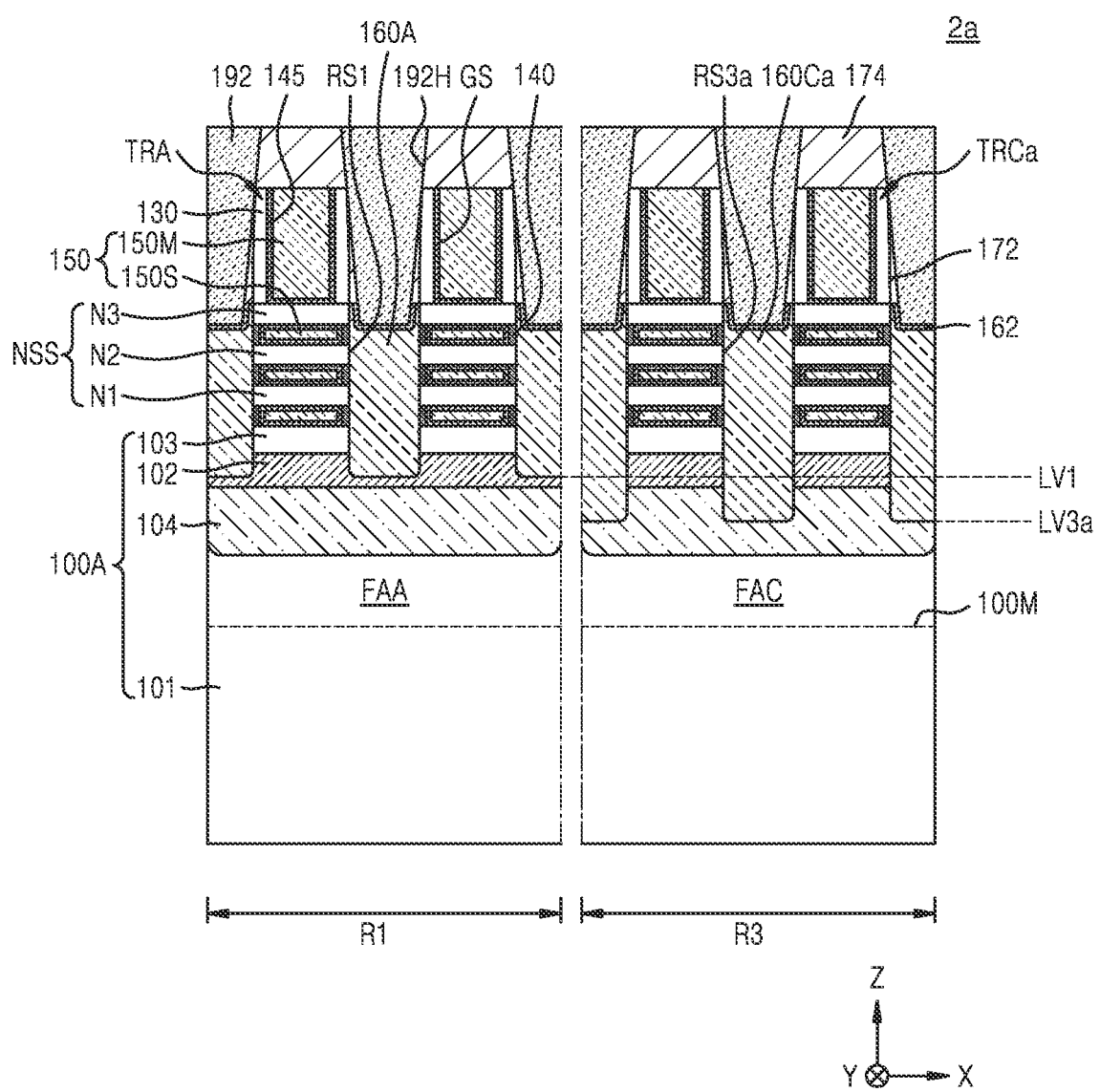

FIGS. 20A and 20B are cross-sectional views of integrated circuit devices, according to some embodiments. FIGS. 20A and 20B are cross-sectional views illustrating the X-Z surfaces.

Referring to FIG. 20, an integrated circuit device 2 may include the plurality of first transistors TRA equipped in the first region R1, and a plurality of third transistors TRC equipped in a third region R3. Each of the first transistor TRA and the third transistor TRC may include a multi-gate MOSFET. In some embodiments, the first transistor TRA equipped in the first region R1 and the third transistor TRC equipped in the third region R3 may include a multi-gate nMOSFET. In some embodiments, one of the first region R1 and the third region R3 may be an SRAM region, and the other may be a logic region.

The integrated circuit device 2 may include the plurality of first fin-type active areas FAA and a plurality of third fin-type active areas FAC that protrude upward in the vertical direction (Z direction) from the main surface 100M of the substrate including the SOI substrate layer 100A, and the plurality of nanosheet stacked structures NSS that face the upper surfaces of the plurality of first fin-type active areas FAA and the plurality of third fin-type active areas FAC from locations spaced apart in the vertical direction (Z direction) from the upper surfaces of the plurality of first fin-type active areas FAA and the plurality of third fin-type active areas FAC.

The plurality of nanosheet stacked structures NSS may be spaced apart from the upper surfaces of the plurality of first fin-type active areas FAA and the plurality of third fin-type active areas FAC. The plurality of nanosheet stacked structures NSS may include the plurality of nanosheets N1, N2, and N3 that extend in parallel with the upper surfaces of the plurality of first fin-type active areas FAA and the plurality of third fin-type active areas FAC on the substrate including the SOI substrate layer 100A.

The plurality of gate electrodes 150 may extend in the second horizontal direction (Y direction) that crosses the first horizontal direction (X direction), and may extend on the plurality of first fin-type active areas FAA and the plurality of third fin-type active areas FAC. The gate electrode 150 may include the main gate unit 150M that covers the upper surface of the nanosheet stacked structure NSS, and the plurality of sub-gate units 150S that are connected to the main gate unit 150M and formed in spaces between the plurality of first fin-type active areas FAA and the plurality of third fin-type active areas FAC and the plurality of nanosheets N1, N2, and N3, that is, under each of the plurality of nanosheets N1, N2, and N3. The gate dielectric layer 145 may separate the nanosheet stacked structure NSS and the gate electrode 150.

In the first region R1, the plurality of first source/drain regions 160A may be formed on the plurality of first fin-type active areas FAA, and in the third region R3, the plurality of third source/drain regions 160C may be formed on the plurality of third fin-type active areas FAC. In some embodiments, the plurality of first source/drain regions 160A and the plurality of third source/drain regions 160C may include the same material as each other. For example, the plurality of first source/drain regions 160A and the plurality of third source/drain regions 160C may include Si, but not Ge. Each of the plurality of first source/drain regions 160A and the plurality of third source/drain regions 160C may be connected to adjacent ends of the plurality of nanosheets N1, N2, and N3. In the first region R1, the plurality of first source/drain regions 160A may fill a plurality of first recess regions RS1, and extend into the SOI substrate layer 100A.

In some embodiments, in the first region R1, each of the plurality of first source/drain regions 160A may penetrate the cover substrate layer 103, and extend into the insulating substrate layer 102, and the lower surface of each of the plurality of first source/drain regions 160A may contact the insulating substrate layer 102. In the third region R3, the plurality of third source/drain regions 160C may fill a plurality of third recess regions RS3, and extend into the SOI substrate layer 100A. In some embodiments, in the third region R3, each of the plurality of third source/drain regions 160C may penetrate the cover substrate layer 103, and extend into the insulating substrate layer 102, and the lower surface of each of the plurality of third source/drain regions 160C may contact the insulating substrate layer 102. The lower surface of the first source/drain region 160A may be at the first vertical level LV1, and the lower surface of the third source/drain region 160C may be located at a third vertical level LV3 higher than the first vertical level LV1, or farther from the main surface 100M.

The gate spacer 130 sequentially covering side walls of the gate electrode 150 may be formed on the plurality of nanosheet stacked structures NSS, the plurality of first fin-type active areas FAA, and the plurality of third fin-type active areas FAC.

In the first region R1, the insulating spacer 140 that contacts the first source/drain region 160A may be formed in a space between each of the plurality of nanosheets N1, N2, and N3, and in the third region R3, the insulating spacer 140 that contacts the third source/drain region 160C may be formed in a space between each of the plurality of nanosheets N1, N2, and
N3.

The inter-gate insulating layer 172 and the inter-layer insulating layer 174 may be sequentially formed on the plurality of first source/drain regions 160Aa and the plurality of third source/drain regions 160C. The plurality of first contact plugs 192 may be connected to the plurality of first source/drain regions 160A and the plurality of third source/drain regions 160C. The plurality of first contact plugs 192 may penetrate the inter-layer insulating layer 174 and the inter-gate insulating layer 172, and may be connected to the plurality of first source/drain regions 160A and the plurality of third source/drain regions 160C. The metal silicide layer 162 may be arranged between the plurality of first source/drain regions 160A and the plurality of third source/drain regions 160C, and the first contact plug 192.

Referring to FIG. 20b, an integrated circuit device 2a may include the plurality of first transistors TRA equipped in the first region R1, and a plurality of third transistors TRCa equipped in the third region R3. Each of the first transistor TRA and the third transistor TRCa may include a multi-gate MOSFET. In some embodiments, the first transistor TRA equipped in the first region R1 and the third transistor TRCa equipped in the third region R3 may include a multi-gate nMOSFET. In some embodiments, one of the first region R1 and the third region R3 may be an SRAM region, and the other may be a logic region.

In the first region R1, the plurality of first source/drain regions 160A may be formed on the plurality of first fin-type active areas FAA, and in the third region R3, the plurality of third source/drain regions 160Ca may be formed on the plurality of third fin-type active areas FAC. In some embodiments, the plurality of first source/drain regions 160A and the plurality of third source/drain regions 160Ca may include the same material as each other. For example, the plurality of first source/drain regions 160A and the plurality of third source/drain regions 160Ca may include Si, but not Ge. Each of the plurality of first source/drain regions 160A and the plurality of third source/drain regions 160Ca may be connected to adjacent ends of the plurality of nanosheets N1, N2, and N3. In the first region R1, the plurality of first source/drain regions 160A may fill a plurality of first recess regions RS1, and extend into the SOI substrate layer 100A. In some embodiments, in the first region R1, each of the plurality of first source/drain regions 160A may penetrate the cover substrate layer 103, and extend into the insulating substrate layer 102, and the lower surface of each of the plurality of first source/drain regions 160A may contact the insulating substrate layer 102. In the third region R3, the plurality of third source/drain regions 160Ca may fill a plurality of third recess regions RS3a, and extend into the SOI substrate layer 100A. In some embodiments, in the third region R3, each of the plurality of third source/drain regions 160Ca may penetrate the cover substrate layer 103 and the insulating substrate layer 102, and extend into the first impurity region 104 of the base substrate layer 101, and a lower surface of each of the plurality of third source/drain regions 160Ca may contact a first impurity region 102. The lower surface of the first source/drain region 160A may be at the first vertical level LV1, and the lower surface of the third source/drain region 160Ca may be located at a third vertical level LV3a lower than the first vertical level LV1, or closer to the main surface 100M.

Figure 21:
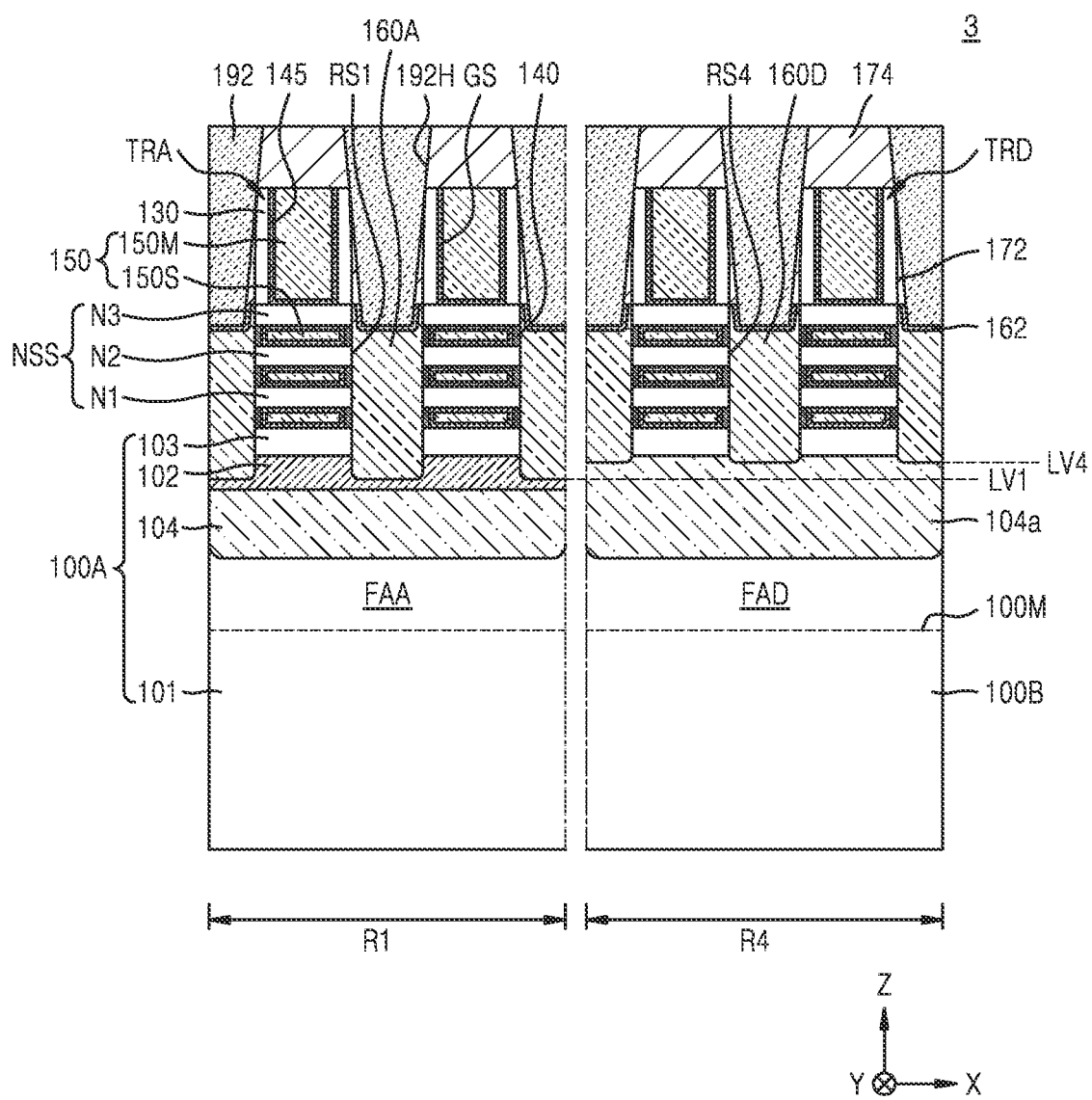
FIG. 21 is a cross-sectional view of an integrated circuit device, according to some embodiments.

FIG. 21 is a cross-sectional view of an integrated circuit device, according to an embodiment. FIG. 21 is a cross-sectional view illustrating the X-Z surface.

Referring to FIG. 21, an integrated circuit device 3 may include the plurality of first transistors TRA equipped in the first region R1, and a plurality of four transistors TRD equipped in a fourth region R4. Each of the first transistor TRA and the fourth transistor TRD may include a multi-gate MOSFET. In some embodiments, the first transistor TRA equipped in the first region R1 and the fourth transistor TRD equipped in the fourth region R4 may include a multi-gate nMOSFET. In some embodiments, one of the first region R1 and the fourth region R4 may be an SRAM region, and the other may be a logic region.

The integrated circuit device 3 may include the plurality of first fin-type active areas FAA and the plurality of fourth fin-type active areas FAD that protrude upward in the vertical direction (Z direction) from the main surface 100M of the substrate including the SOI substrate layer 100A and the semiconductor substrate layer 100B, and the plurality of nanosheet stacked structures NSS that face upper surfaces of the plurality of first fin-type active areas FAA and the plurality of fourth fin-type active areas FAD from locations spaced apart from the plurality of first fin-type active areas FAA and the plurality of fourth fin-type active areas FAD. The plurality of first fin-type active areas FAA may protrude upward in the vertical direction (Z direction) from the main surface 100M of the SOI substrate layer 100A in the first region R1, and the plurality of fourth fin-type active areas FAD may protrude upward in the vertical direction (Z direction) from the main surface 100M of the semiconductor substrate layer 100B in the fourth region R4.

Instead of the second impurity region 105 formed on the semiconductor substrate layer 100B in the second region R2 of the integrated circuit device 1 illustrated in FIGS. 14A and 14B, the integrated circuit device 4 may include a third impurity region 104a formed on the semiconductor substrate layer 100B in the fourth region R4. The first impurity region 104 may be formed by injecting impurity of a first conductivity into a portion of the SOI substrate layer 100A, and the third impurity region 104a may be formed by injecting impurity of a first conductivity into a portion of the semiconductor substrate layer 100B. In some embodiments, a shape of the third impurity region 104a may be substantially the same as a shape of the second impurity region 105 illustrated in FIGS. 14A and 14B.

The plurality of nanosheet stacked structures NSS may be spaced apart from the upper surfaces of the plurality of first fin-type active areas FAA and the plurality of fourth fin-type active areas FAD. The plurality of nanosheet stacked structures NSS may include the plurality of nanosheets N1, N2, and N3 that extend in parallel with the upper surfaces of the plurality of first fin-type active areas FAA and the plurality of fourth fin-type active areas FAD on the substrate including the SOI substrate layer 100A and the semiconductor substrate layer 100B. The plurality of nanosheets N1, N2, and N3 of one nanosheet stacked structure NSS may be sequentially stacked one-by-one on the upper surfaces of the plurality of first fin-type active areas FAA and the plurality of fourth fin-type active areas FAD.

The plurality of gate electrodes 150 may extend in the second horizontal direction (Y direction) that cross the first horizontal direction (X direction), and may extend on the plurality of first fin-type active areas FAA and the plurality of fourth fin-type active areas FAD. Each of the plurality of gate electrodes 150 may cover the nanosheet stacked structure NSS, and surround at least a portion of the plurality of nanosheet stacked structures NSS. The gate electrode 150 may include the main gate unit 150M that covers the upper surface of the nanosheet stacked structure NSS, and the plurality of sub-gate units 150S that are connected to the main gate unit 150M and formed in spaces between the plurality of first fin-type active areas FAA and the plurality of fourth fin-type active areas FAD and the plurality of nanosheets N1, N2, and N3, that is, under each of the plurality of nanosheets N1, N2, and N3. The gate dielectric layer 145 may separate the nanosheet stacked structure NSS and the gate electrode 150.

In the first region R1, the plurality of first source/drain regions 160A may be formed on the plurality of first fin-type active areas FAA, and in the fourth region R4, the plurality of fourth source/drain regions 160D may be formed on the plurality of fourth fin-type active areas FAD. Each of the plurality of first source/drain regions 160A and the plurality of fourth source/drain regions 160D may be connected to adjacent ends of the plurality of nanosheets N1, N2, and N3. In some embodiments, the plurality of first source/drain regions 160A and the plurality of fourth source/drain regions 160D may include the same material as each other.

In the first region R1, each of the plurality of first source/drain regions 160A may extend into the SOI substrate layer 100A. In some embodiments, in the first region R1, each of the plurality of first source/drain regions 160A may penetrate the cover substrate layer 103, and extend into the insulating substrate layer 102, and the lower surface of each of the plurality of first source/drain regions 160A may contact the insulating substrate layer 102. In the fourth region R4, each of the plurality of fourth source/drain regions 160D may extend into the semiconductor substrate layer 100B, and a lower surface of each of the plurality of fourth source/drain regions 160D may contact the third impurity region 104a. The lower surface of the first source/drain region 160A may be at the first vertical level LV1, and the lower surface of the fourth source/drain region 160D may be located at a fourth vertical level LV4 higher than the first vertical level LV1 or farther from the main surface 100M.

The gate spacer 130 sequentially covering side walls of the gate electrode 150 may be formed on the plurality of nanosheet stacked structures NSS, the plurality of first fin-type active areas FAA, and the plurality of fourth fin-type active areas FAD.

In the first region R1, the insulating spacer 140 that contacts the first source/drain region 160A may be formed in a space between each of the plurality of nanosheets N1, N2, and N3, and in the fourth region R4, the insulating spacer 140 that contacts the fourth source/drain region 160D may be formed in a space between each of the plurality of nanosheets N1, N2, and N3.

The inter-gate insulating layer 172 and the inter-layer insulating layer 174 may be sequentially formed on the plurality of first source/drain regions 160A and the plurality of fourth source/drain regions 160D. Each of the inter-gate insulating layer 172 and the inter-layer insulating layer 174 may include a silicon oxide layer, but the present disclosure is not limited thereto.

The plurality of first contact plugs 192 may be connected to the plurality of first source/drain regions 160A and the plurality of fourth source/drain regions 160D. The plurality of first contact plugs 192 may penetrate the inter-layer insulating layer 174 and the inter-gate insulating layer 172, and may be connected to the plurality of first source/drain regions 160A and the plurality of fourth source/drain regions 160D. The metal silicide layer 162 may be arranged between the plurality of first source/drain regions 160A and the plurality of fourth source/drain regions 160D, and the first contact plug 192.

Figure 22A:
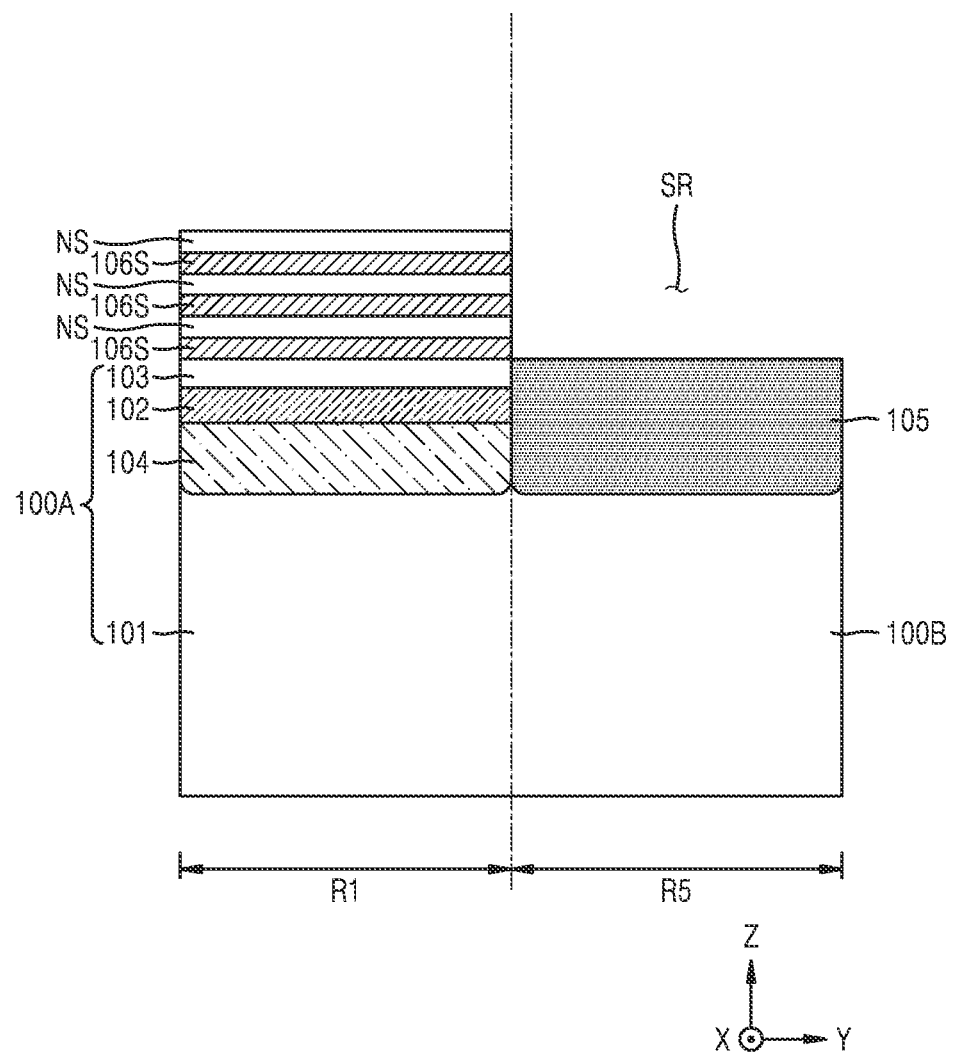
FIGS. 22A through 23B are cross-sectional views illustrating a manufacturing method of an integrated circuit device, and illustrate the integrated circuit device manufactured by using the manufacturing method, according to some embodiments.
Figure 22B:
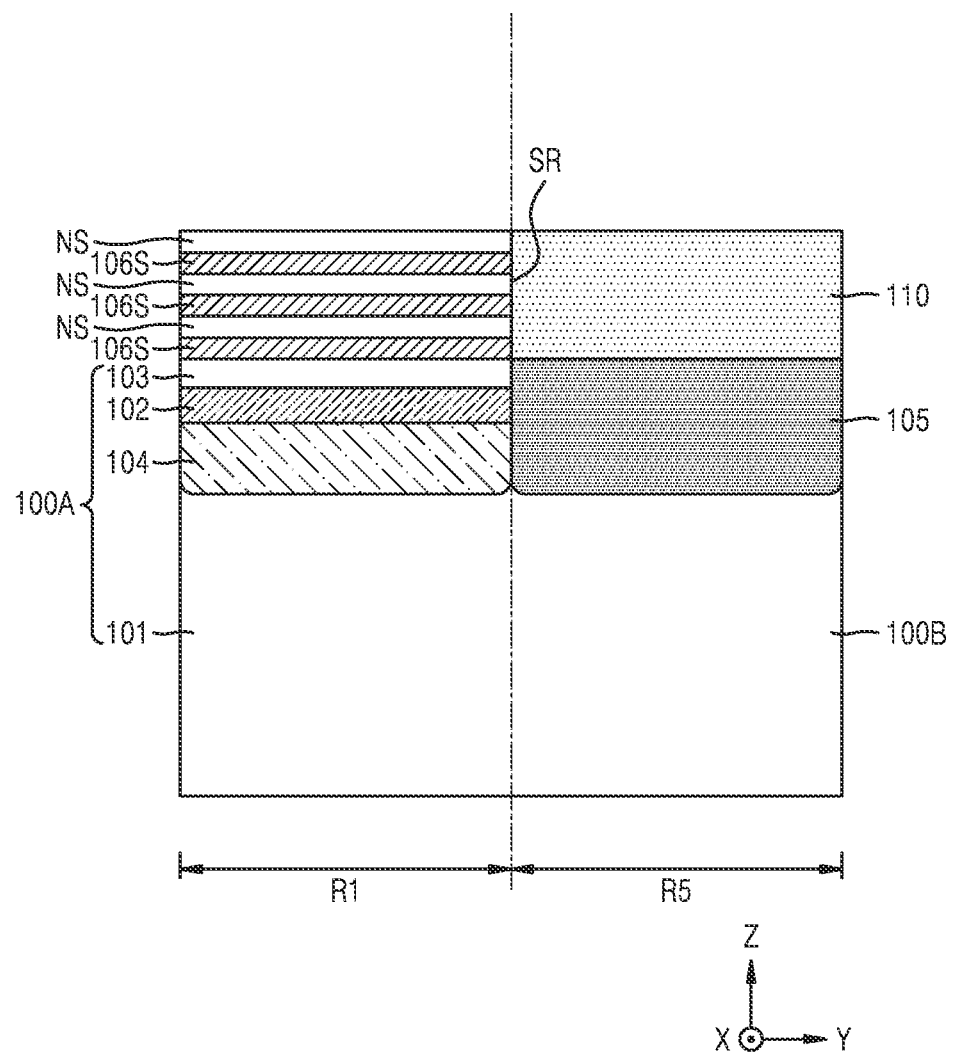
Figure 23A:
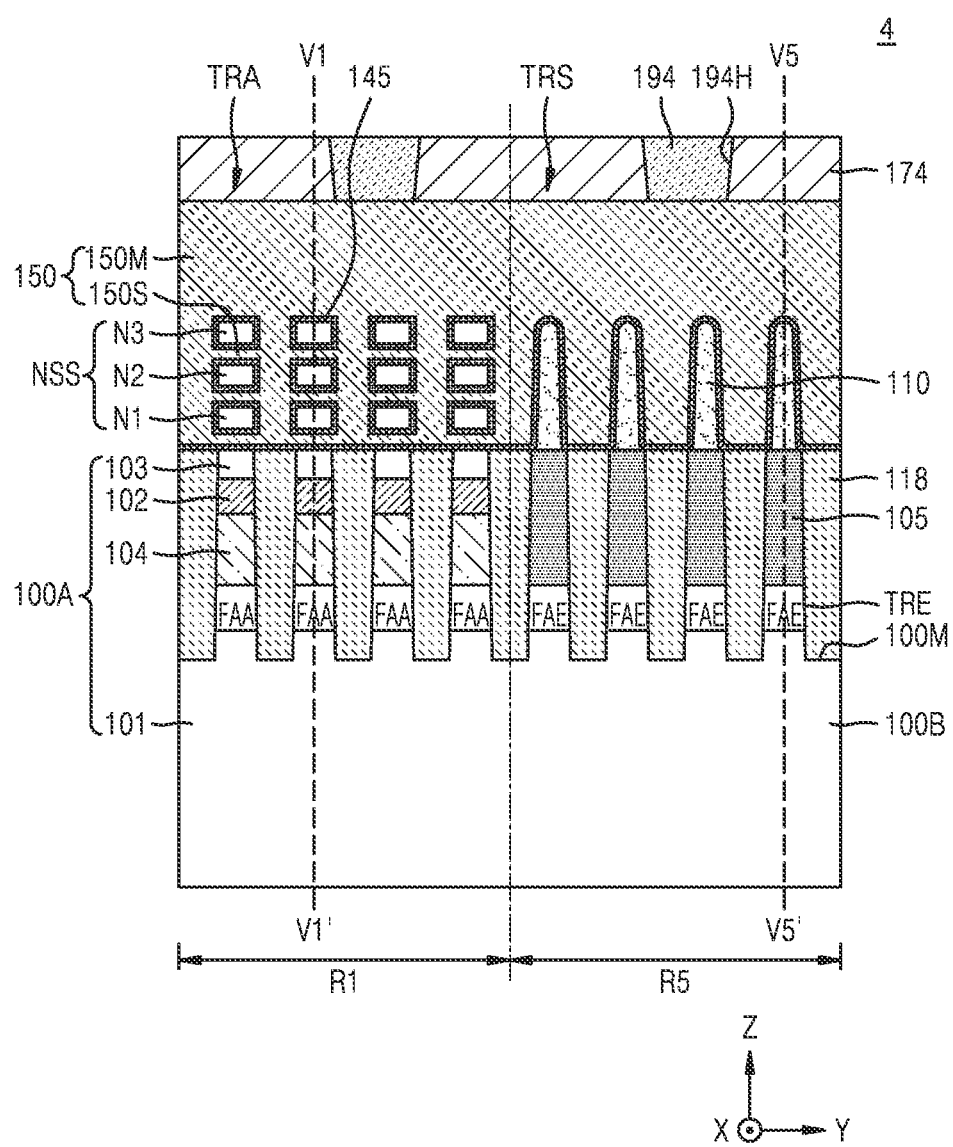
Figure 23B:
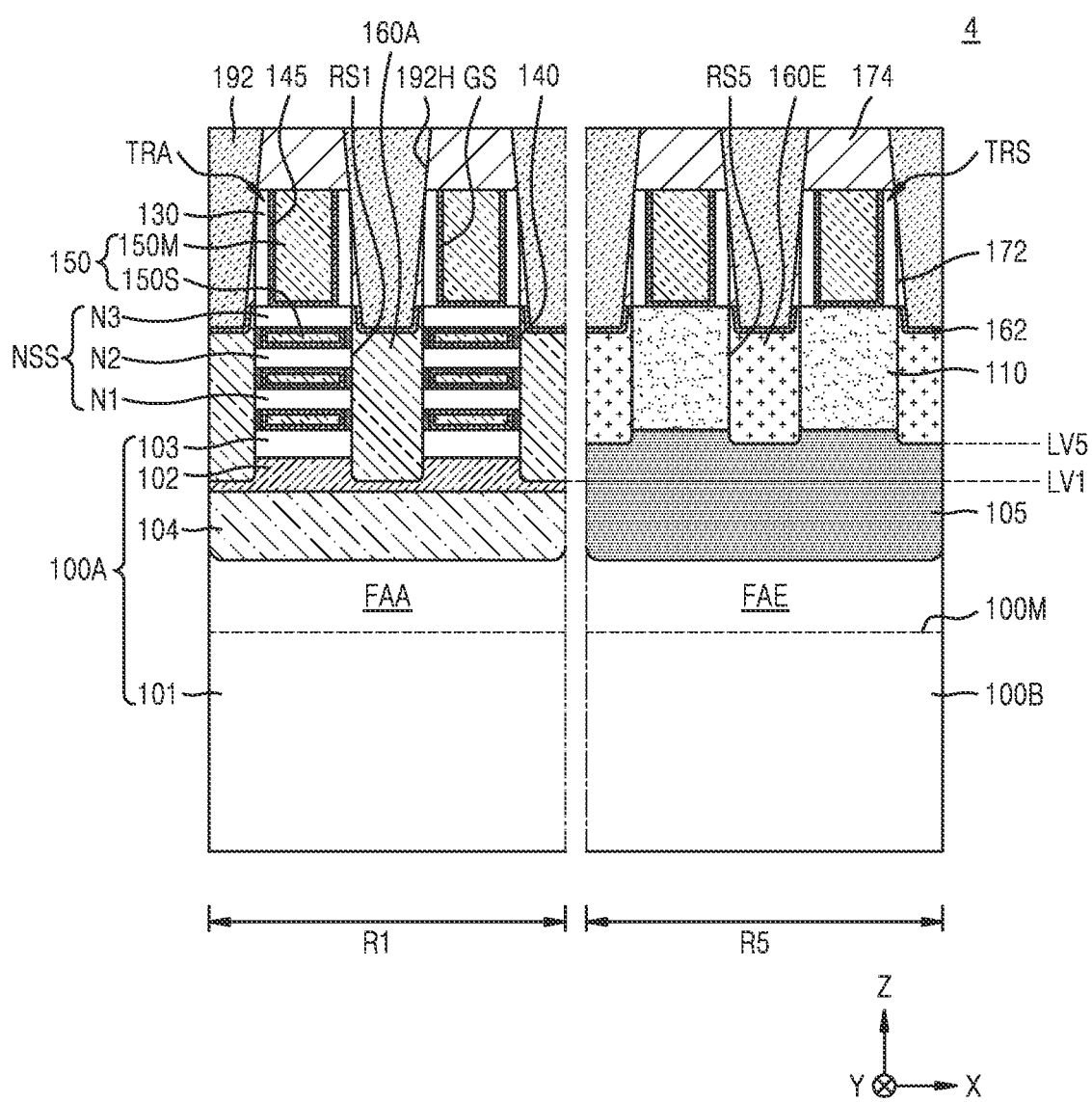

FIGS. 22A through 23B are cross-sectional views illustrating a manufacturing method of an integrated circuit device, and describing the integrated circuit device manufactured by using the manufacturing method according to manufacturing sequences, according to some embodiments. FIGS. 22A through 23A are cross-sectional views illustrating a Y-Z surface, and FIG. 23B is a cross-sectional view illustrating the Y-Z surface taken along V1-V1' and V5-V5' lines in FIG. 23A.

Referring to FIG. 22A, a stacked structure of alternately arranged ones of a plurality of sacrificial semiconductor layers 106S and one of a plurality of nanosheet semiconductor layers NS may be formed on a substrate including the first region R1 in which the SOI substrate layer 100A is arranged and a fifth region R5 in which the semiconductor substrate layer 100B is arranged. A stack recess SR may be formed by removing a portion of the stacked structure of the plurality of sacrificial semiconductor layers 106S and the plurality of nanosheet semiconductor layers NS formed in the fifth region R5. As a result, the upper surface of the semiconductor substrate layer 100B may be exposed in the fifth region R5. In some embodiments, the semiconductor substrate layer 100B in the fifth region R5 may be substantially the same as the semiconductor substrate layer 100B in the second region R2 illustrated in FIG. 5.

Referring to FIG. 22B, a semiconductor epi-layer 110 may be formed on the semiconductor substrate layer 100B in the fifth region R5. The semiconductor epi-layer 110 may include a semiconductor material. The semiconductor epi-layer 110 may be formed to have the same crystallization as the semiconductor substrate layer 100B. In some embodiments, the semiconductor epi-layer 110 may include a semiconductor material of the same type as the semiconductor substrate layer 100B. In some embodiments, the semiconductor epi-layer 110 may include a different type of semiconductor material having the same crystallization as the semiconductor substrate layer 100B.

The semiconductor epi-layer 110 may be formed with an impurity of the same conductivity as the second impurity region 105. For example, the impurity of a second conductivity may be injected into the semiconductor epi-layer 110.

In some embodiments, in the fifth region R5, similarly to the first region R1 in FIG. 5, a structure similar to that illustrated in FIG. 22B may be formed, by stacking alternately ones of the plurality of sacrificial semiconductor layers 106S and ones of the plurality of nanosheet semiconductor layers NS on the SOI substrate layer 100A, then removing all of a portion formed in a stacked structure of the plurality of sacrificial semiconductor layers 106S and the plurality of nanosheet semiconductor layers NS in the fifth region R5, and also a portion of the cover substrate layer 103 and the insulating substrate layer 102 in the fifth region R5, and then forming an epi-layer corresponding to the second impurity region 105 and the semiconductor epi-layer 110 in the epitaxial growth method.

Referring to FIGS. 23A and 23B together, the integrated circuit device 4 may be formed by performing processes similar to those described with reference to FIGS. 6 through 14B on a result of FIG. 22B. The integrated circuit device 4 may include the plurality of first fin-type active areas FAA and the plurality of fifth fin-type active areas FAE that protrude upward in the vertical direction (Z direction) from the main surface 100M of the substrate including the SOI substrate layer 100A and the semiconductor substrate layer 100B, and the plurality of nanosheet stacked structures NSS that face the upper surfaces of the plurality of first fin-type active areas FAA from locations spaced apart from the upper surfaces of the plurality of first fin-type active areas FAA in the first region R1. The plurality of first fin-type active areas FAA may protrude upward in the vertical direction (Z direction) from the main surface 100M of the SOI substrate layer 100A in the first region R1, and the plurality of fifth fin-type active areas FAE may protrude upward in the vertical direction (Z direction) from the main surface 100M of the semiconductor substrate layer 100B in the fifth region R5.

The plurality of trenches TRE may limit or define the plurality of first fin-type active areas FAA and the plurality of fifth fin-type active areas FAE on the substrate including the SOI substrate layer 100A and the semiconductor substrate layer 100B. Side walls of the plurality of first fin-type active areas FAA and the plurality of fifth fin-type active areas FAE may be covered by a device separating layer 118 that fills the plurality of trenches TRE. Levels of the upper surfaces of the plurality of first fin-type active areas FAA, a level of an upper surface of the second impurity region 105 of the plurality of fifth fin-type active areas FAE, and a level of an upper surface of the device separating layer 118 from the main surface 100M may be equal, the same as, or similar to each other.

The plurality of nanosheet stacked structures NSS may be spaced apart from the upper surfaces of the plurality of first fin-type active areas FAA. The plurality of nanosheet stacked structures NSS may include the plurality of nanosheets N1, N2, and N3 extending in parallel with the upper surfaces of the plurality of first fin-type active areas FAA on the SOI substrate layer 100A. The plurality of nanosheets N1, N2, and N3 of one nanosheet stacked structure NSS may be sequentially stacked one-by-one on the upper surfaces of the plurality of first fin-type active areas FAA.

The nanosheet stacked structure NSS of the plurality of nanosheets N1, N2, and N3 may be arranged on the plurality of first fin-type active areas FAA in the first region R1, and may be located substantially at the same level as the semiconductor epi-layer 110 of each of the plurality of fifth fin-type active areas FAE in the fifth region R5. In other words, the nanosheet stacked structure NSS of the plurality of nanosheets N1, N2, and N3 may be arranged on the plurality of first fin-type active areas FAA in the first region R1 to be located substantially at the same level as upper portions of the plurality of fifth fin-type active areas FAE in the fifth region R5 from the main surface 100M.

The plurality of gate electrodes 150 may extend in the second horizontal direction (Y direction) that crosses the first horizontal direction (X direction), and may extend on the plurality of first fin-type active areas FAA and the plurality of fifth fin-type active areas FAE. At least some of the plurality of gate electrodes 150 may overlap in the vertical direction (Z direction) each of the plurality of nanosheet stacked structures NSS in the first region R1, and may also overlap in the vertical direction (Z direction) the plurality of fifth fin-type active areas FAE in a periphery circuit region PR.

In the first region R1, each of the plurality of gate electrodes 150 may cover the nanosheet stacked structure NSS, and surround at least a portion of the plurality of nanosheet stacked structures NSS. In the first region R1, the gate electrode 150 may include the main gate unit 150M that covers the upper surface of the nanosheet stacked structure NSS, and the plurality of sub-gate units 150S that are connected to the main gate unit 150M and formed in spaces between the first fin-type active area FAA and the plurality of nanosheets N1, N2, and N3, that is, under each of the plurality of nanosheets N1, N2, and N3. The gate dielectric layer 145 may separate the nanosheet stacked structure NSS and the gate electrode 150.

In the fifth region R5, the plurality of gate electrodes 150 may cover surfaces of the plurality of fifth fin-type active areas FAE. In the fifth region R5, the plurality of gate electrodes 150 may include only the main gate unit 150M, and may not include the sub-gate unit 150S. The gate dielectric layer 145 may separate the fifth fin-type active area FAE and the gate electrode 150.

In the first region R1, the plurality of first source/drain regions 160A may be formed on the plurality of first fin-type active areas FAA. In the first region R1, each of the plurality of first source/drain regions 160A may be connected to adjacent ends of the plurality of nanosheets N1, N2, and N3. In the fifth region R5, a plurality of fifth source/drain regions 160E may be connected to side walls of fifth fin-type active area FAE adjacent to each other of the plurality of fifth fin-type active areas FAE. In the first region R1, each of the plurality of first source/drain regions 160A may extend into the SOI substrate layer 100A. In some embodiments, in the first region R1, each of the plurality of first source/drain regions 160A may penetrate the cover substrate layer 103, and extend into the insulating substrate layer 102, and the lower surface of each of the plurality of first source/drain regions 160A may contact the insulating substrate layer 102. In the fifth region R5, each of the plurality of fifth source/drain regions 160E may extend into the semiconductor substrate layer 100B, and the lower surface of each of the plurality of fifth source/drain regions 160E may contact the second impurity region 105. The lower surface of the first source/drain region 160A may be at the first vertical level LV1, and the lower surface of the fifth source/drain region 160E may be located at a fifth vertical level LV5 higher than the first vertical level LV1 or farther from the main surface 100M.

The integrated circuit device 4 may include a plurality of first transistors TRA equipped in the first region R1, and a plurality of fifth transistors TRS equipped in the fifth region R5. The first transistor TRA may include a multi-gate MOSFET, and the fifth transistor TRS may include a single-gate MOSFET. In some embodiments, the first transistor TRA equipped in the first region R1 may include a multi-gate nMOSFET, and the fifth transistor TRS equipped in the fifth region R5 may include a multi-gate pMOSFET. In some other embodiments, the first transistor TRA equipped in the first region R1 may include a multi-gate nMOSFET, and the fifth transistor TRS equipped in the fifth region R5 may include a multi-gate nMOSFET.

The gate spacer 130 sequentially covering the side walls of the gate electrode 150 may be formed on the plurality of nanosheet stacked structures NSS and the plurality of fifth fin-type active areas FAE. In the first region R1, the insulating spacer 140 that contacts the first source/drain region 160A may be formed in the space between each of the plurality of nanosheets N1, N2, and N3.

The inter-gate insulating layer 172 and the inter-layer insulating layer 174 may be sequentially formed on the plurality of first source/drain regions 160A and the plurality of fifth source/drain regions 160E.

The plurality of first contact plugs 192 may be connected to the plurality of first source/drain regions 160A and the plurality of fifth source/drain regions 160E. The plurality of first contact plugs 192 may penetrate the inter-layer insulating layer 174 and the inter-gate insulating layer 172, and may be connected to the plurality of first source/drain regions 160A and the plurality of fifth source/drain regions 160E. The metal silicide layer 162 may be arranged between the plurality of first source/drain regions 160A and the plurality of fifth source/drain regions 160E, and the first contact plug 192.

The plurality of second contact plugs 194 may be connected to the plurality of gate electrodes 150. The second contact plug 194 may penetrate an inter-layer insulating layer 174, and be connected to the gate electrode 150.

In some embodiments of the present disclosure, integrated circuit devices may include at least two regions of a first region R1, a second region R2, a third region R3, a fourth region R4, and/or a fifth region R5, which are illustrated in FIGS. 1-23B and described with reference to integrated circuit devices 1, 1a, 1b, 1c, 1d, le, 2, 2a, 3, and 4. Such embodiments should be easily understood by those skilled in the art in view of the above discussion, and thus, will not be separately illustrated.

In addition, among components commonly arranged in at least two regions of the first region R1, the second region R2, the third region R3, the fourth region R4, and the fifth region R5, components arranged in different regions from each other may be respectively and differently referred to as a first, a second, etc. For example, nanosheet stacked structures NSS including a plurality of nanosheets N1, N2, and N3 arranged in the first region R1 and the second region R2 may be referred to as a first nanosheet stacked structure including a plurality of first nanosheets, and a second nanosheet structure including a plurality of second nanosheets, respectively.

While the inventive concepts have been particularly shown and described with reference to examples of embodiments thereof, it will be understood that various changes in form and details may be made therein without departing from the scope of the following claims.

What is claimed is:

1. An integrated circuit device comprising:
   a first region comprising a semiconductor on insulator (SOI) substrate layer comprising a base substrate layer, an insulating substrate layer, and a cover substrate layer;
   a second region comprising a semiconductor substrate layer;
   a plurality of first fin-type active areas in defined by a first plurality of trenches in the first region, the first fin-type active areas protruding from a main surface of the SOI substrate layer and extending in a first horizontal direction;
   a plurality of second fin-type active areas defined by a second plurality of trenches in the second region, the second fin-type active areas protruding from a main surface of the semiconductor substrate layer and extending in the first horizontal direction;
   a plurality of nanosheet stacked structures above the plurality of first fin-type active areas and the plurality of second fin-type active areas, each of the plurality of nanosheet stacked structures comprising a plurality of nanosheets extending in parallel with each other and spaced apart from upper surfaces of the plurality of first fin-type active areas and the plurality of second fin-type active areas;
   a plurality of first source/drain regions between adjacent nanosheet stacked structures in the first region, each of the first source/drain regions extending into the SOI substrate layer and in contact with the insulating substrate layer and having a lower surface at a first vertical level; and
   a plurality of second source/drain regions in the second region, each of the plurality of second source/drain regions extending into the semiconductor substrate layer and having a lower surface at a second vertical level that is farther from the main surface of the SOI substrate layer and the main surface of the semiconductor substrate layer than the first vertical level.

2. The integrated circuit device of claim 1, wherein the plurality of first source/drain regions extend through the cover substrate layer and extend into the insulating substrate layer.

3. The integrated circuit device of claim 1, wherein the plurality of first source/drain regions extend through the cover substrate layer and contact the insulating substrate layer, but do not extend into the insulating substrate layer.

4. The integrated circuit device of claim 1, wherein the plurality of first source/drain regions extend through the cover substrate layer and the insulating substrate layer, and contact the base substrate layer.

5. The integrated circuit device of claim 1, further comprising:
   a third region comprising the SOI substrate layer;
   a plurality of third fin-type active areas defined by a third plurality of trenches in the third region, the third fin-type active areas protruding from the main surface of the SOI substrate layer and extending in the first horizontal direction;
   nanosheet stacked structures above the plurality of third fin-type active areas, each comprising a plurality of nanosheets; and
   a plurality of third source/drain regions between adjacent nanosheet stacked structures above the plurality of third fin-type active areas, the third source/drain regions extending into the SOI substrate layer to contact the insulating substrate layer, the plurality of third source/ drain regions comprising lower surfaces thereof at a third vertical level above the main surface of the SOI substrate layer and the main surface of the semiconductor substrate layer that is different from the first vertical level.

6. The integrated circuit device of claim 5, wherein each of the plurality of first source/drain regions and the plurality of third source/drain regions extends through the cover substrate layer and extends into the insulating substrate layer, and
the first vertical level is closer to the main surface of the SOI substrate layer and the main surface of the semiconductor substrate layer than the third vertical level.

7. The integrated circuit device of claim 5, wherein the plurality of first source/drain regions extend through the cover substrate layer and extend into the insulating substrate layer,
wherein the plurality of third source/drain regions extend through the cover substrate layer and the insulating substrate layer and contact the base substrate layer, and
wherein the first vertical level is farther from the main surface of the SOI substrate layer and the main surface of the semiconductor substrate layer than the third vertical level.

8. The integrated circuit device of claim 1, further comprising:
a plurality of gate electrodes that extend in a second horizontal direction that crosses the first horizontal direction, the plurality of gate electrodes extending on the plurality of first fin-type active areas and the plurality of second fin-type active areas, the plurality of gate electrodes each comprising a main gate unit above a respective one of the nanosheet stacked structures and a plurality of sub-gate units underneath each of the nanosheets of the respective one of the nanosheet stacked structures; and
a gate dielectric layer that separates the plurality of gate electrodes and nanosheet stacked structures.

9. The integrated circuit device of claim 8, further comprising:
a plurality of insulating spacers in the first region, the plurality of insulating spacers between the plurality of first source/drain regions and the plurality of nanosheets, the plurality of insulating spacers covering first and second ends of the plurality of sub-gate units with the gate dielectric layer therebetween.

10. The integrated circuit device of claim 9, wherein, in the second region, the gate dielectric layer is arranged between the plurality of sub-gate units and the plurality of second source/drain regions, and directly contacts the plurality of sub-gate units and the plurality of second source/drain regions.

11. The integrated circuit device of claim 1, further comprising:
a fourth region comprising the semiconductor substrate layer;
a plurality of fourth fin-type active areas defined by the plurality of trenches and extending in the first horizontal direction;
nanosheet stacked structures above the plurality of fourth fin-type active areas, each comprising a plurality of nanosheets; and
a plurality of fourth source/drain regions between adjacent nanosheet stacked structures above the plurality of fourth fin-type active areas, each of the plurality of fourth source/drain regions extending into the semiconductor substrate layer, and comprising a material identical to a material of the plurality of first source/drain regions.

12. The integrated circuit device of claim 1, further comprising:
an air gap between the plurality of first source/drain regions and the insulating substrate layer.

13. An integrated circuit device comprising:
a semiconductor on insulator (SOI) substrate layer comprising a base substrate layer, an insulating substrate layer, and a cover substrate layer in a first region;
a semiconductor substrate layer in a second region;
a plurality of first fin-type active areas and a plurality of second fin-type active areas defined by a plurality of trenches and extending in a first horizontal direction, on the SOI substrate layer and the semiconductor substrate layer, respectively;
a plurality of first nanosheets extending in parallel with each other and spaced apart in a vertical direction from the plurality of first fin-type active areas;
a plurality of gate electrodes extending in a second horizontal direction that crosses the first horizontal direction, the plurality of gate electrodes on the plurality of first fin-type active areas and the plurality of second fin-type active areas, first portions of the plurality of gate electrodes between vertically adjacent first nanosheets;
a gate dielectric layer between the first nanosheets and plurality of first fin-type active areas;
a plurality of first source/drain regions between horizontally adjacent first nanosheets above the plurality of first fin-type active areas, each of the plurality of first source/drain regions extending into the SOI substrate layer to contact the insulating substrate layer and having a lower surface at a first vertical level above the plurality of first fin-type active areas; and
a plurality of second source/drain regions above the plurality of second fin-type active areas, each of the plurality of second source/drain regions extending into the semiconductor substrate layer and having a lower surface that is at a second vertical level above the plurality of second fin-type active areas that is higher than the first vertical level.

14. The integrated circuit device of claim 13, further comprising a plurality of second nanosheets extending in parallel with each other and spaced apart in a vertical direction from the plurality of second fin-type active areas, wherein second portions of the plurality of gate electrodes are between vertically adjacent second nanosheets.

15. The integrated circuit device of claim 13, wherein at least one of the first nanosheets is coplanar with an upper portion of at least one of the plurality of second fin-type active areas.

16. The integrated circuit device of claim 13, further comprising:
a first impurity region in a portion of the SOI substrate layer comprising a first impurity type; and a second impurity region, in a portion of the semiconductor substrate, in contact with the plurality of second source/drain regions and comprising a second impurity type.

17. The semiconductor circuit device of claim 16, wherein the first impurity region is arranged in a portion of an upper side of the base substrate layer, and
wherein the plurality of first source/drain regions are free from contact with the first impurity region.

18. The semiconductor circuit device of claim 16, wherein the first impurity region is arranged in a portion of an upper side of the base substrate layer, and wherein the plurality of first source/drain regions contact the first impurity region.

19. An integrated circuit device comprising:
a semiconductor on insulator (SOI) substrate layer comprising a base substrate layer, an insulating substrate layer, and a cover substrate layer in a first region;
a semiconductor substrate layer in a second region different from the first region;
a first impurity region in a portion of the SOI substrate layer comprising a first impurity type;
a second impurity region in a portion of the semiconductor substrate layer comprising a second impurity type;
a plurality of first fin-type active areas and a plurality of second fin-type active areas defined by a plurality of trenches and extending in a first horizontal direction, on the SOI substrate layer and the semiconductor substrate layer, respectively;
a plurality of nanosheet stacked structures each comprising a plurality of nanosheets extending in parallel with each other and spaced apart from upper surfaces of the plurality of first fin-type active areas and the plurality of second fin-type active areas;
a plurality of first source/drain regions connected to ends of the plurality of nanosheets adjacent to each other on the plurality of first fin-type active areas, the plurality of first source/drain regions extending through the cover substrate layer and into the insulating substrate layer, and comprising lower surfaces that are at a first vertical level;
a plurality of second source/drain regions extending into the semiconductor substrate layer and contacting the second impurity region on the plurality of second fin-type active areas, the plurality of second source/drain regions comprising lower surfaces that are at a second vertical level that is higher than the first vertical level;
a plurality of gate electrodes extending in a second horizontal direction that crosses the first horizontal direction, the plurality of gate electrodes extending on the plurality of first fin-type active areas and the plurality of second fin-type active areas, each of the plurality of gate electrodes comprising a main gate unit above a respective one of the plurality of nanosheet stacked structures, and a plurality of sub-gate units each underneath a respective nanosheet of the plurality of nanosheets of the respective one of the plurality of nanosheet stacked structures;
a gate dielectric layer arranged between the plurality of gate electrodes and the plurality of nanosheets; and
a plurality of insulating spacers in the first region between the plurality of first fin-type active areas and the plurality of nanosheets, the plurality of insulating spacers covering first and second ends of each of the plurality of sub-gate units with the gate dielectric layer therebetween.

20. The integrated circuit device of claim 19, wherein the insulating substrate layer has a thickness of about 10 nm to about 20 nm, wherein lower surfaces of the plurality of first source/drain regions contact the insulating substrate layer, and wherein the first impurity region is not in contact with the lower surfaces of the plurality of first source/drain regions.

* * * * *